(12) United States Patent
Kord et al.

(10) Patent No.: US 10,804,583 B2
(45) Date of Patent: Oct. 13, 2020

(54) MAGNETLESS NON-RECIPROCAL DEVICES USING MODULATED FILTERS

(71) Applicant: Board of Regents, The University of Texas System, Austin, TX (US)

(72) Inventors: Ahmed Kord, Austin, TX (US);
Andrea Alu, New York, NY (US);
Dimitrios Sounas, Detroit, MI (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 16/332,077

(22) PCT Filed: Sep. 13, 2017

(86) PCT No.: PCT/US2017/051270
§ 371 (c)(1),
(2) Date: Mar. 11, 2019

(87) PCT Pub. No.: WO2018/052935
PCT Pub. Date: Mar. 22, 2018

(65) Prior Publication Data
US 2019/0372190 A1 Dec. 5, 2019

Related U.S. Application Data

(60) Provisional application No. 62/395,687, filed on Sep. 16, 2016.

(51) Int. Cl.
| | |
|---|---|
| H01P 1/36 | (2006.01) |
| H01P 1/38 | (2006.01) |
| H03H 7/38 | (2006.01) |
| H03H 7/42 | (2006.01) |
| H03H 11/04 | (2006.01) |
| H04B 1/04 | (2006.01) |

(Continued)

(52) U.S. Cl.
CPC .................. *H01P 1/36* (2013.01); *H01P 1/38* (2013.01); *H03H 7/38* (2013.01); *H03H 7/42* (2013.01); *H03H 11/04* (2013.01); *H04B 1/04* (2013.01); *H04B 1/16* (2013.01); *H04L 5/14* (2013.01)

(58) Field of Classification Search
CPC ..... H01P 1/32; H01P 1/36; H01P 1/38; H03H 7/42; H03H 11/04; H04L 5/14
(Continued)

(56) References Cited

U.S. PATENT DOCUMENTS

| | | |
|---|---|---|
| 5,101,179 A | 3/1992 | Jarrett et al. |
| 2015/0030280 A1 | 1/2015 | Alu et al. |
| 2015/0102869 A1 | 4/2015 | Wang |

OTHER PUBLICATIONS

Written Opinion of the International Searching Authority for International Application No. PCT/US2017/051270 dated Feb. 13, 2018, pp. 1-6.

(Continued)

*Primary Examiner* — Stephen E. Jones
(74) *Attorney, Agent, or Firm* — Robert A. Voigt, Jr.; Winstead PC

(57) ABSTRACT

A magnet-free non-reciprocal device realized using modulated filters. The device includes one or more filters in one or more branches, where each branch connects two ports or a port and a central node. The poles and zeros of each of the first, second and third filters are modulated in time such that degenerate modes at each pole and zero is split thereby destructively interfering at one or more output ports and adding up at another output port allowing non-reciprocal transmission, isolation and/or non-reciprocal phase shift. The device is able to realize a magnet-free full-duplex communication scheme implementing a magnet-free circulator for radio frequency cancellation or a magnet-free isolator or gyrator.

66 Claims, 47 Drawing Sheets

(51) Int. Cl.
    *H04B 1/16*    (2006.01)
    *H04L 5/14*    (2006.01)
(58) Field of Classification Search
    USPC .................................................. 333/1.1, 24.2
    See application file for complete search history.

(56) References Cited

OTHER PUBLICATIONS

Kord et al., "CMOS Integrated Magnetless Circulators Based on Spatiotemporal Modulation Angular-Momentum Biasing," Submitted to IEEE Transactoins on Microwave Theory and Techniques, 2019, pp. 1-13.

Kord et al., "Magnet-Less Circulators Based on Spatiotemporal Modulation of Bandstop Filters in a Delta Topology," IEEE Transactions on Microwave Theory and Techniques, vol. 66, No. 2, Feb. 2018, pp. 911-926.

Kord et al., "Pseudo-Linear Time-Invariant Magnetless Circulators Based on Differential Spatiotemporal Modulation of Resonant Junctions," IEEE Transactions on Microwave Theory and Techniques, vol. 66, No. 6, Jun. 2018, pp. 2731-2745.

Kord et al., "N-Way High Power Magnetless Circulators with Near-Zero Spurious Emission," Submitted to IEEE Transactions on Circuits and Systems I: Regular Papers, 2019, pp. 1-9.

Kord et al., "Broadband Cyclic-Symmetric Magnetless Circulators and Theoretical Bounds on Their Bandwidth," IEEE Transactions on Microwave Theory and Techniques, vol. 66, No. 12, Dec. 2018, pp. 5472-5481.

International Preliminary Report on Patentability for International Application No. PCT/US2017/051270 dated Mar. 19, 2019, pp. 1-7.

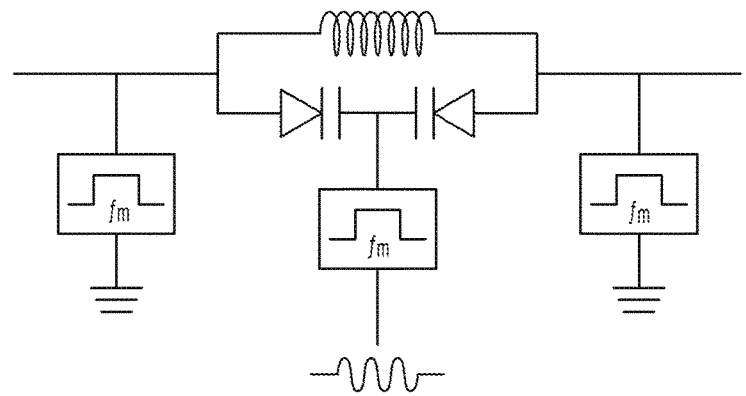
FIG. 12A
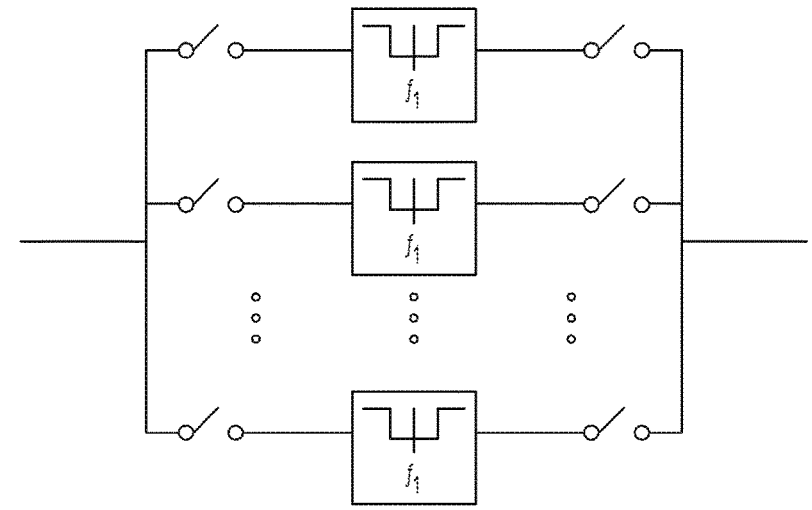
FIG. 12B
FIG. 12C
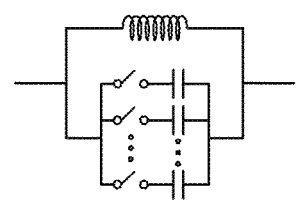

FIG. 16
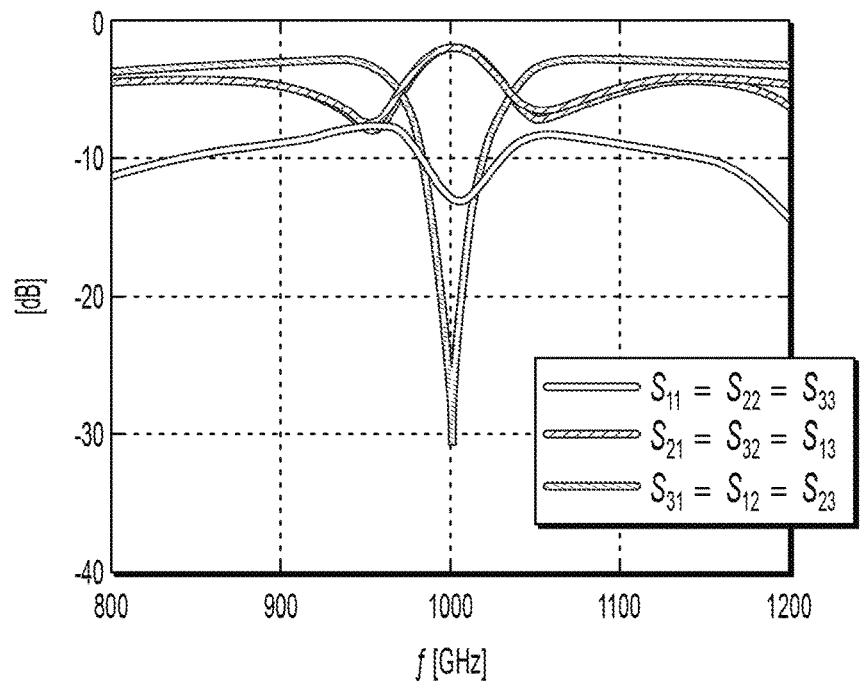
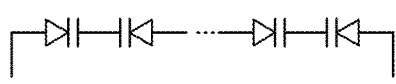
FIG. 17A
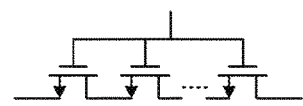
FIG. 17B

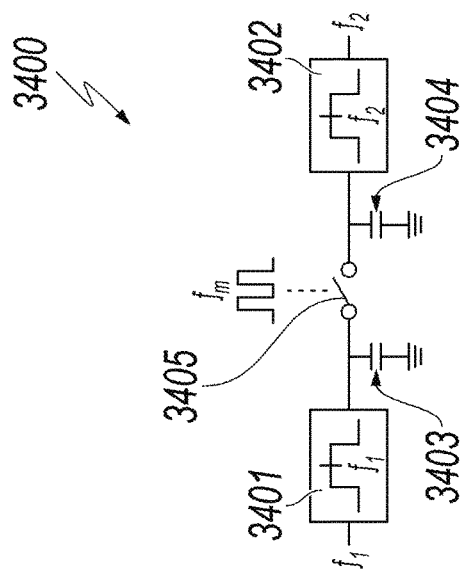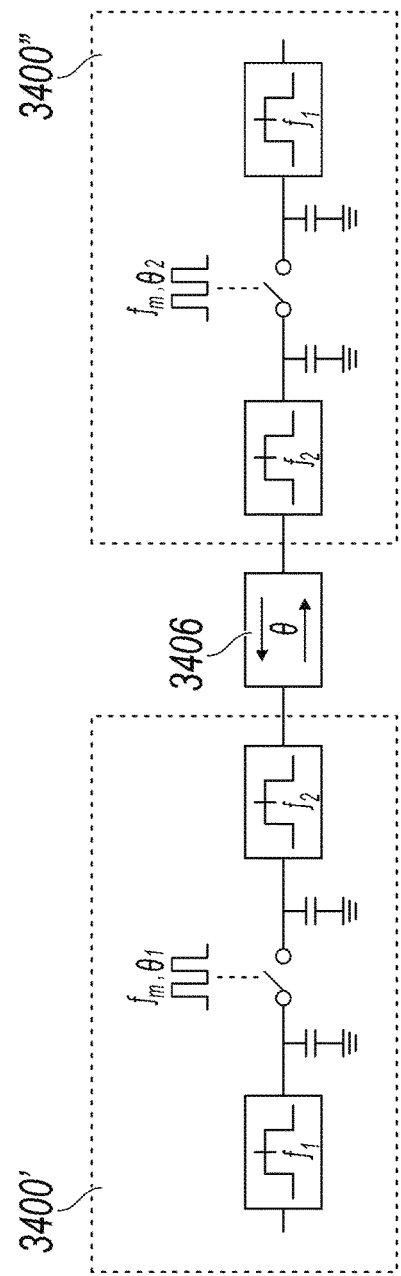
FIG. 34A
FIG. 34B

MAGNETLESS NON-RECIPROCAL DEVICES USING MODULATED FILTERS

CROSS REFERENCE TO RELATED APPLICATIONS

This application claims priority to U.S. Provisional Patent Application Ser. No. 62/395,687, entitled "Magnetless Non-Reciprocal Devices Using Modulated Filters," filed on Sep. 16, 2016, which is incorporated by reference herein in its entirety.

GOVERNMENT INTERESTS

This invention was made with government support under Grant No. HDTRA1-12-1-0022 awarded by the Defense Threat Reduction Agency and Grant No. FA9550-13-1-0204 awarded by the Air Force Office of Scientific Research. The U.S. government has certain rights in the invention.

TECHNICAL FIELD

The present invention relates generally to wireless communication, and more particularly to enabling wireless communication in a full-duplex system using modulated filters.

BACKGROUND

Wireless communication has significantly advanced since the 1st generation of cellular services was launched in Japan in 1979. Yet, all the deployed systems up-to-date are still half-duplex, employing either frequency or time division for bi-directional communication, therefore limiting the maximum transmission rate. In a full-duplex system, both the transmitter (TX) and the receiver (RX) operate simultaneously at the same frequency, which, in principle, doubles the capacity of wireless channels. This would have a significant impact on network and communication systems operating in a crowded electromagnetic (EM) spectrum and provide a solution to many problems, such as hidden terminals, high end-to-end latency, fairness and congestion, among many others. The key challenge in full-duplexing is to have a sufficient isolation between the TX and RX nodes (typically>100 dB) to avoid self-interference, i.e., saturation of the RX's front-end by the strong TX signal. Self-interference cancellation (SIC) at levels dictated by commercial standards is very challenging, and full-duplex operation was, therefore, presumed impossible for a long time. In order to invalidate this assumption and overcome the SIC problem, several works from both academic and industrial groups have recently proposed to use a combination of radio-frequency (RF) and baseband digital signal processing (DSP) cancellation techniques. Cancellation in the digital domain is computationally intensive and very challenging especially with non-linear distortion of RF circuits and random effects, such as oscillator noise. But more importantly, it fails in providing enough isolation at the RX node, since the TX interference saturates the RF path and the analog-to-digital converters (ADC), thus corrupting the received signal before the digital cancellation circuitry even has a chance to clean it. Therefore, RF cancellation is a necessity in full-duplex systems, leveraging DSP techniques as a complementary approach to eliminate any residual interference. RF cancellation can be classified into three main categories: (i) antenna-based, (ii) circulator-based and (iii) mixed-signal approaches. Antenna-based techniques rely on beam forming to create a null at the RX node, and therefore require at least two antennas, which not only makes the self-interference cancellation very sensitive to the antennas' placement, but more importantly weakens the argument for full-duplex as compared to conventional multi-input-multi-output (MIMO) systems which can also double the throughput using two antennas.

Mixed signal approaches exploit that the TX signal is already known, and therefore, try to subtract it at the RX node. However, once the baseband signal is up-converted to the carrier frequency and gone through the noisy non-linear RF chain, the actual transmitted signal becomes very different. Therefore, mixed signal approaches, if not carefully designed, may end up adding more interference at the RX. In order to achieve a moderate level of cancellation, the RF chain has to be modeled very accurately, which is computationally expensive, complicates the system's design considerably and above all is insufficient to achieve on its own the 100 dB SIC specification.

Circulator-based approaches, however, can avoid the aforementioned problems of antenna and mixed-signal approaches, since they allow the use of a single antenna (ANT), while they block signal transmission from TX to RX. Nevertheless, circulators come with their own challenge, such as the necessity of breaking reciprocity. At its simplest form, Lorentz reciprocity states that transmission between two points in a circuit is identical, regardless of the circuit's complexity. In order to break reciprocity and realize devices, such as circulators, isolators, non-reciprocal phase shifters and many others, one may either use: (i) magnetic-biased anisotropic materials, (ii) active components, e.g., transistors, (iii) non-linearities, or (iv) time-variation. For decades, non-reciprocity was almost exclusively achieved through magnetic biasing of ferrite materials, leading to bulky devices, which are incompatible with conventional integrated circuit technologies. To eliminate the use of a magnet, both active and non-linear approaches had been pursued over the years, but they suffered from a fundamental poor noise figure, limited power handling and small dynamic range, resulting in such devices not being deployed in any commercial system. It is not surprising that these challenges played a role in reinforcing the long-held assumption of full-duplexing not being realizable. Yet, recently when this assumption was revisited at both the network and physical layer levels, time-variant circuits were presented as a potential alternative towards non-reciprocity, without the drawbacks of previous approaches. It is worth highlighting that these are passive magnetic-free circuits, whether time variation is realized using varactors or even transistors, since the transistors are not used in a gain mode but rather to implement a switched passive element, and therefore they can overcome by orders of magnitude the noise and power handling limitations of active and non-linear approaches.

In this regard, the idea of parametrically modulating a transmission line (TL) by loading it with varactors and injecting a strong modulation signal at one port, such that it allows propagation in one direction (the direction opposite to propagation of the modulation signal) as a conventional TL while, in the opposite direction, it mixes the injected modulation with the RF signals, upconverting the latter to a different frequency has been presented. However, such an approach necessitates the TL length to be larger than the wavelength, and more importantly it requires the use of a diplexer to isolate the two counter-propagating RF signals in the frequency spectrum, thus making it not suitable for integration and less attractive as compared to high performance magnetic-biased circulators.

Alternatively, staggered commutation using N-path filters was shown to be equivalent to a miniaturized non-reciprocal phase shifter, which when embedded in a loop of reciprocal phase shifters can lead to an asymmetric circulator. The asymmetry improves power handling of the TX/ANT path as compared to the ANT/RX path, but it also results in high sensitivity to impedance mismatches at the RF ports, thus requiring the use of bulky reconfigurable impedance tuners and leading to asymmetric S-parameters. Furthermore, the modulation frequency in this approach is large and in the same order of the RF band's center frequency, which increases power consumption in the modulation path, especially in the RF and mm-wave bands, and complicates the rejection of any modulation leakage at the RF ports due to switch parasitics.

An ultra-wideband asymmetric circulator based on sequentially-switched delay lines (SSDL) has also been proposed. In principle, this approach can achieve very wide bandwidth with large isolation, however, the main challenge is that the switching frequency is inversely proportional to the propagation delay along the transmission lines (TLs) and, therefore, has to be very high for chip-scale implementation. This, in turn, requires super-fast switches which cannot handle high power and, more importantly, the operation becomes susceptible to jitter, random mismatches and noise, thus increasing insertion loss and degrading isolation in practice.

Hence, there is not currently an effective means for RF cancellation using a circulator-based approach that breaks reciprocity in a cost-effective manner without the use of magnets.

SUMMARY

In one embodiment of the present invention, a magnet-free multiple-port non-reciprocal device comprises one or more filters in one or more branches, where each of the one or more branches connects two ports. The poles and zeros of each of the one or more filters are modulated in time such that degenerate modes at each pole and zero are split thereby destructively interfering at one or more output ports and adding up at another output port creating isolation and non-reciprocal operation.

In another embodiment of the present invention, a magnet-free multiple-port non-reciprocal device comprises one or more filters in one or more branches, where each of the one or more branches connects a port and a central node. The poles and zeros of each of the one or more filters are modulated in time such that degenerate modes at each pole and zero are split thereby destructively interfering at one or more output ports and adding up at another output port creating isolation and non-reciprocal operation.

In a further embodiment, a magnet-free multiple-port non-reciprocal device comprises one or more filters, where three or more elements of the one or more filters comprise a central loop and one or more elements of the one or more filters connect a port and a node of the central loop. Poles and zeros of each of the one or more filters are modulated in time such that degenerate modes at each pole and zero are split thereby destructively interfering at one or more output ports and adding up at another output port creating isolation and non-reciprocal operation.

In a further embodiment of the present invention, a magnet-free multiple-port differential non-reciprocal device comprises a first single-ended non-reciprocal device as recited in paragraph [0009]. The magnet-free multiple-port differential non-reciprocal device further comprises a second single-ended non-reciprocal device as recited in paragraph [0009]. The first and second single-ended non-reciprocal devices are fed differentially and an output is sensed differentially, where the first and second single-ended non-reciprocal devices have a 180° phase difference between their modulation signals.

In another embodiment of the present invention, a magnet-free multiple-port differential non-reciprocal device comprises a first single-ended non-reciprocal device as recited in paragraph [0009]. The magnet-free multiple-port differential non-reciprocal device further comprises a second single-ended non-reciprocal device as recited in paragraph [0009]. The first and second single-ended non-reciprocal devices are fed with a common source and an output is sensed with a common load, where the first and second single-ended non-reciprocal devices have a 180° phase difference between their modulation signals.

In another embodiment of the present invention, a magnet-free multiple-port differential non-reciprocal device comprises a first single-ended non-reciprocal device as recited in paragraph [0010]. The magnet-free multiple-port differential non-reciprocal device further comprises a second single-ended non-reciprocal device as recited in paragraph [0010]. The first and second single-ended non-reciprocal devices are fed differentially and an output is sensed differentially, where the first and second single-ended non-reciprocal devices have a 180° phase difference between their modulation signals.

In a further embodiment of the present invention, a magnet-free multiple-port differential non-reciprocal device comprises a first single-ended non-reciprocal device as recited in paragraph [0010]. The magnet-free multiple-port differential non-reciprocal device further comprises a second single-ended non-reciprocal device as recited in paragraph [0010]. The first and second single-ended non-reciprocal devices are fed with a common source and an output is sensed with a common load, where the first and second single-ended non-reciprocal devices have a 180° phase difference between their modulation signals.

In another embodiment of the present invention, a magnet-free multiple-port differential non-reciprocal device comprises a first single-ended non-reciprocal device as recited in paragraph [0011]. The magnet-free multiple-port differential non-reciprocal device further comprises a second single-ended non-reciprocal device as recited in paragraph [0011]. The first and second single-ended non-reciprocal devices are fed differentially and an output is sensed differentially, where the first and second single-ended non-reciprocal devices have a 180° phase difference between their modulation signals.

In a further embodiment, a magnet-free multiple-port differential non-reciprocal device comprises a first single-ended non-reciprocal device as recited in paragraph [0011]. The magnet-free multiple-port differential non-reciprocal device further comprises a second single-ended non-reciprocal device as recited in paragraph [0011]. The first and second single-ended non-reciprocal devices are fed with a common source and an output is sensed with a common load, where the first and second single-ended non-reciprocal devices have a 180° phase difference between their modulation signals.

In another embodiment of the present invention, a magnet-free two-port non-reciprocal phase shifter comprises a first passive intermediate frequency mixer. The magnet-free two-port non-reciprocal phase shifter further comprises a second passive intermediate frequency mixer, where each of the first and second passive intermediate frequency mixers comprise: a first and a second bandpass or bandstop filter; and a switch connecting the first and second bandpass or bandstop filters. The magnet-free two-port non-reciprocal phase shifter additionally comprises a reciprocal phase shifter or delay line connecting the first and second passive intermediate frequency mixers. A switching frequency of the switch of the first and second passive intermediate frequency mixers is equal to a difference between the center frequencies of the first and second bandpass or bandstop filters, where switching signals of the switch of the first and second passive intermediate frequency mixers have a phase shift that is equal to a delay of the reciprocal phase shifter or delay line connecting the first and second passive intermediate frequency mixers.

In a further embodiment of the present invention, a magnet-free multiple-port non-reciprocal device comprises a two-port non-reciprocal device as recited in paragraph [0018] in one branch. The magnet-free multiple-port non-reciprocal device further comprises one or more reciprocal phase shifters or delay lines in one or more branches, where each of the one or more branches connects two ports.

In another embodiment of the present invention, a magnet-free multiple-port non-reciprocal device comprises a two-port non-reciprocal device as recited in paragraph [0018] in one branch. The magnet-free multiple-port non-reciprocal device further comprises one or more reciprocal phase shifters or delay lines in one or more branches, where each of the one or more branches connects a port and a central node.

In a further embodiment of the present invention, a magnet-free two-port differential non-reciprocal phase shifter comprises a first single-ended two-port non-reciprocal device as recited in paragraph [0018]. The magnet-free two-port differential non-reciprocal phase shifter further comprises a second single-ended two-port non-reciprocal device as recited in paragraph [0018], where input ports of the first and second single-ended non-reciprocal devices are connected together. The output ports of the first and second single-ended non-reciprocal devices are connected together, where the first and second single-ended non-reciprocal devices have a 180° phase difference between their modulation signals.

In another embodiment of the present invention, a magnet-free multiple-port non-reciprocal device comprises a two-port non-reciprocal device as recited in paragraph [0021] in one branch. The magnet-free multiple-port non-reciprocal device further comprises one or more reciprocal phase shifters or delay lines in one or more branches, where each of the one or more branches connects two ports.

In a further embodiment of the present invention, a magnet-free multiple-port non-reciprocal device comprises a two-port non-reciprocal device as recited in paragraph [0021] in one branch. The magnet-free multiple-port non-reciprocal device further comprises one or more reciprocal phase shifters or delay lines in one or more branches, where each of the one or more branches connects a port and a central node.

The foregoing has outlined rather generally the features and technical advantages of one or more embodiments of the present invention in order that the detailed description of the present invention that follows may be better understood. Additional features and advantages of the present invention will be described hereinafter which may form the subject of the claims of the present invention.

BRIEF DESCRIPTION OF THE DRAWINGS

A better understanding of the present invention can be obtained when the following detailed description is considered in conjunction with the following drawings, in which.

Figure 5A:
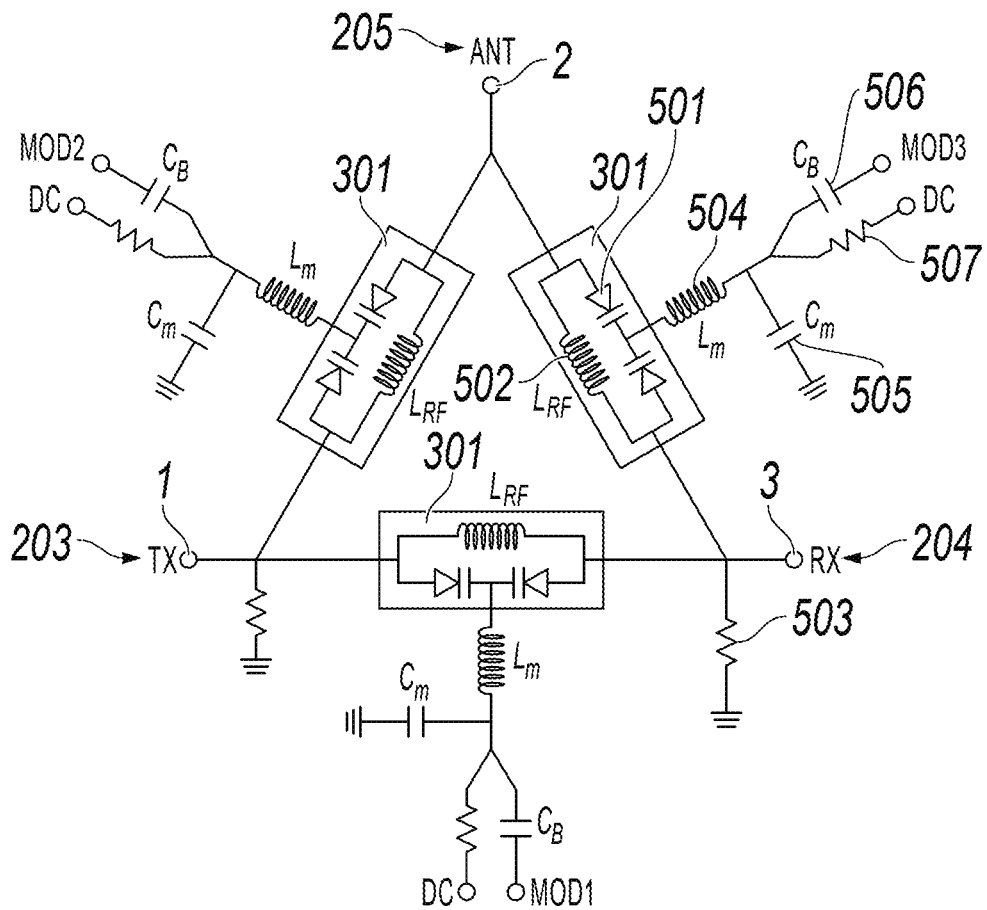
FIG. 5A is a circuit implementation of a $1^{st}$ order bandstop delta circulator in accordance with an embodiment of the present invention.
Figure 7A:
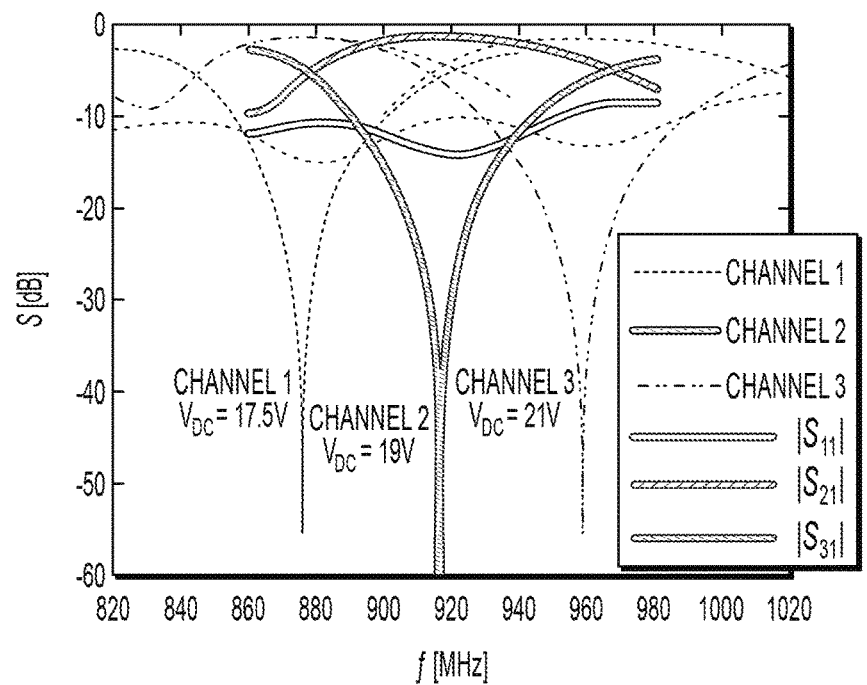
Figure 7B:
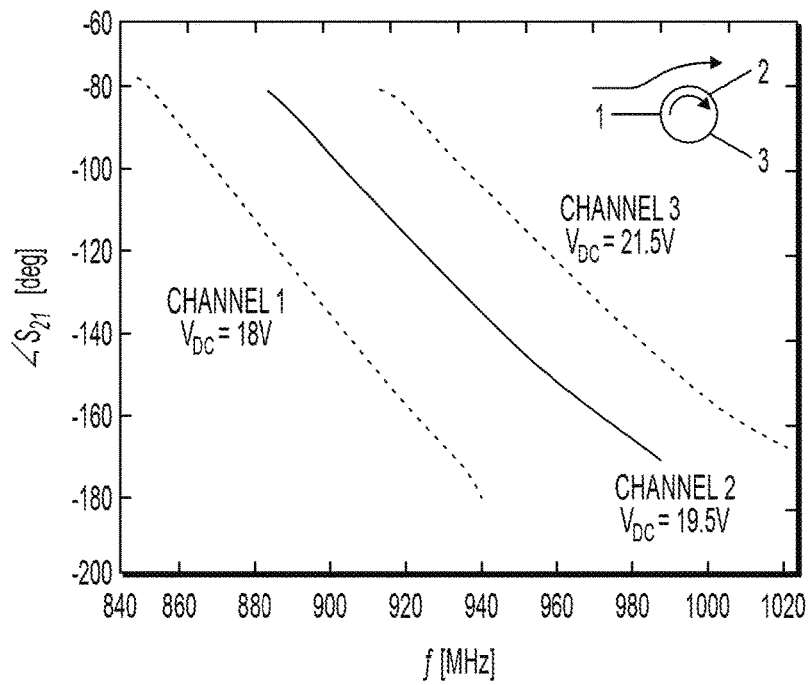
Figure 8:
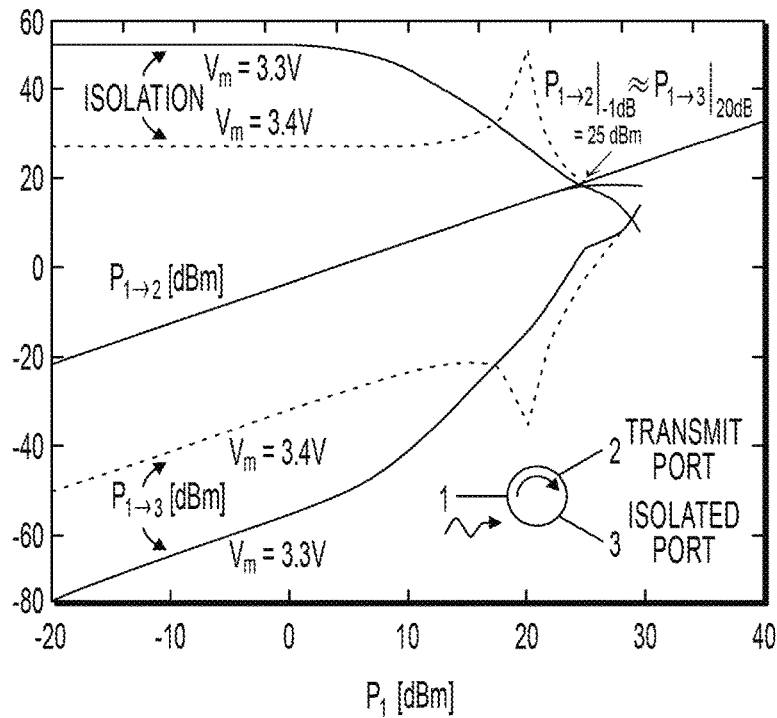
Figure 9:
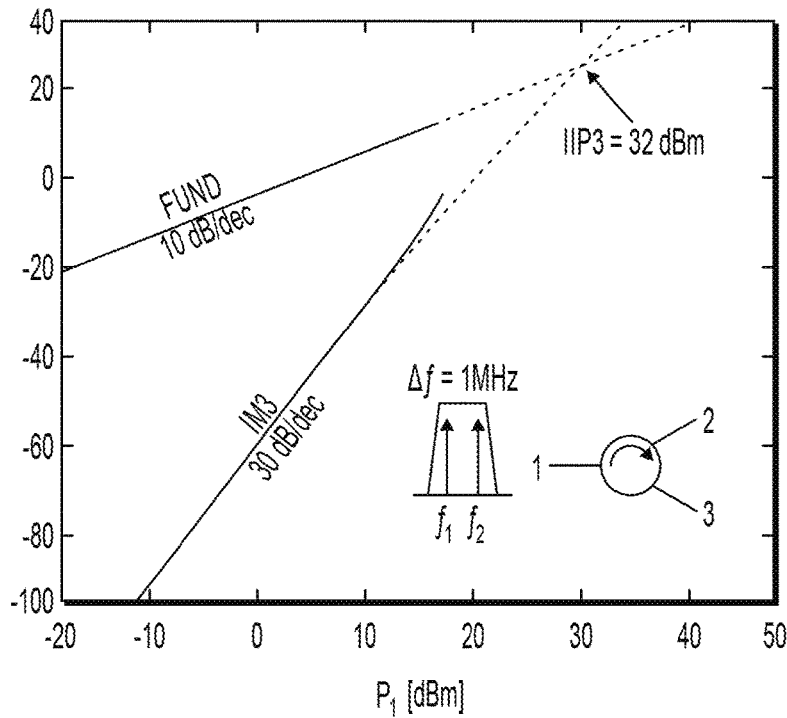
Figure 10:
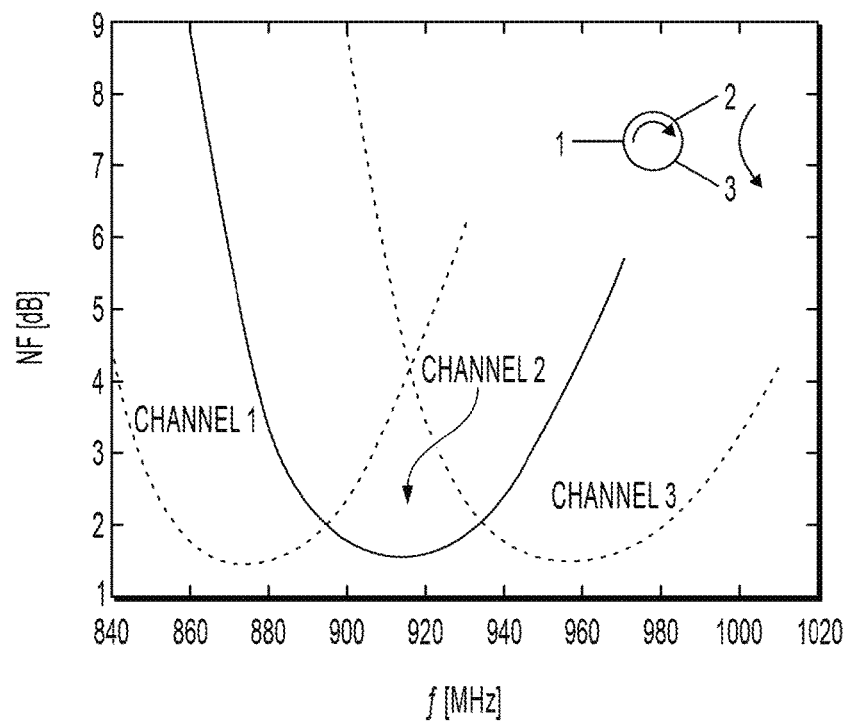
Figure 11A:
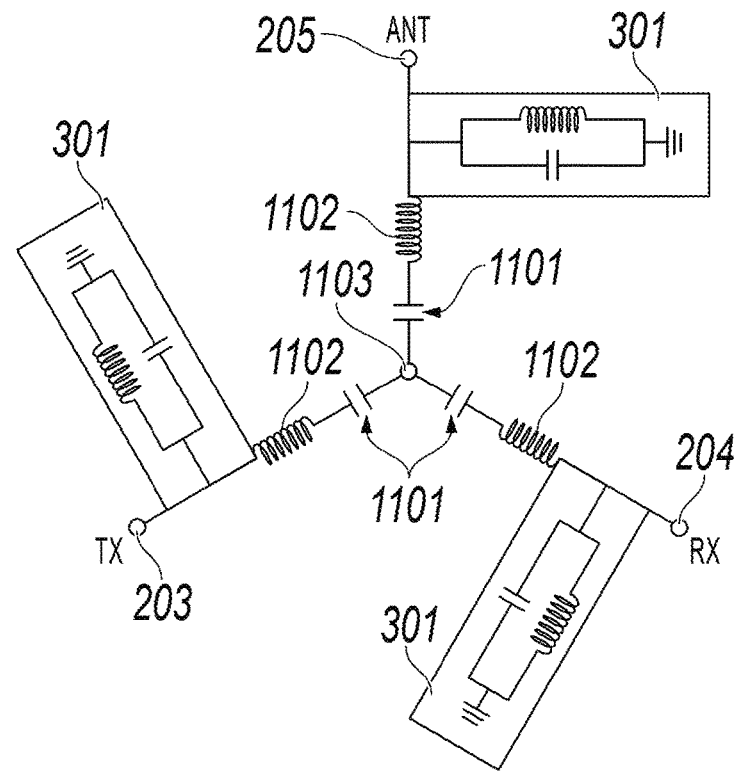
Figure 11B:
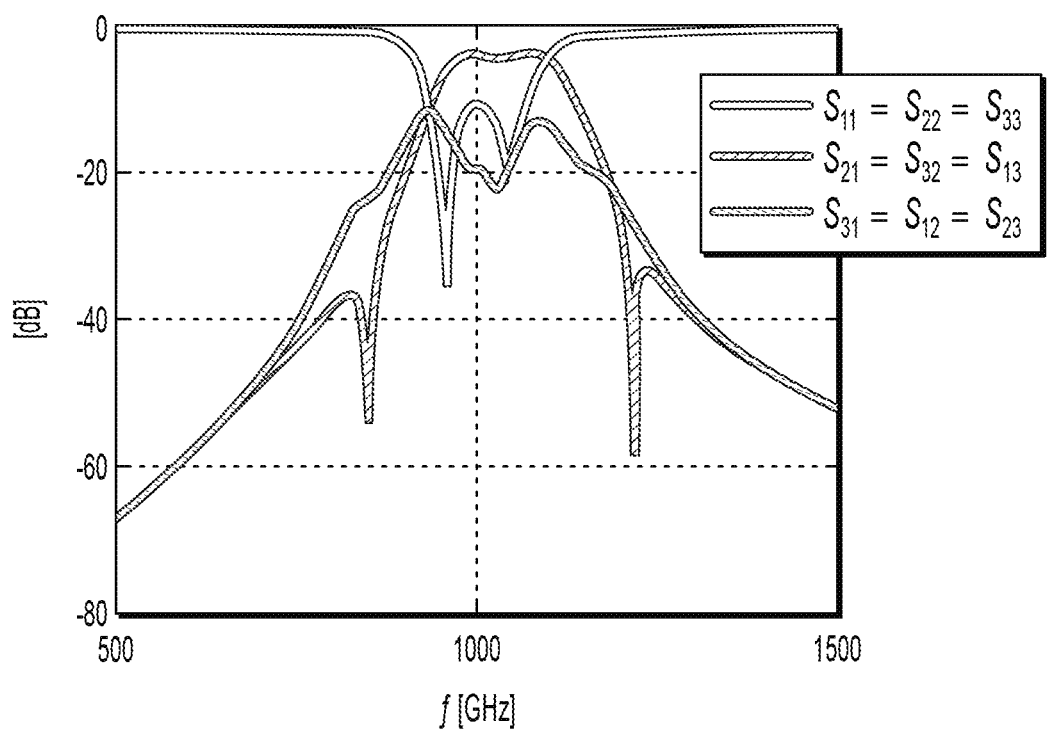
Figure 13A:
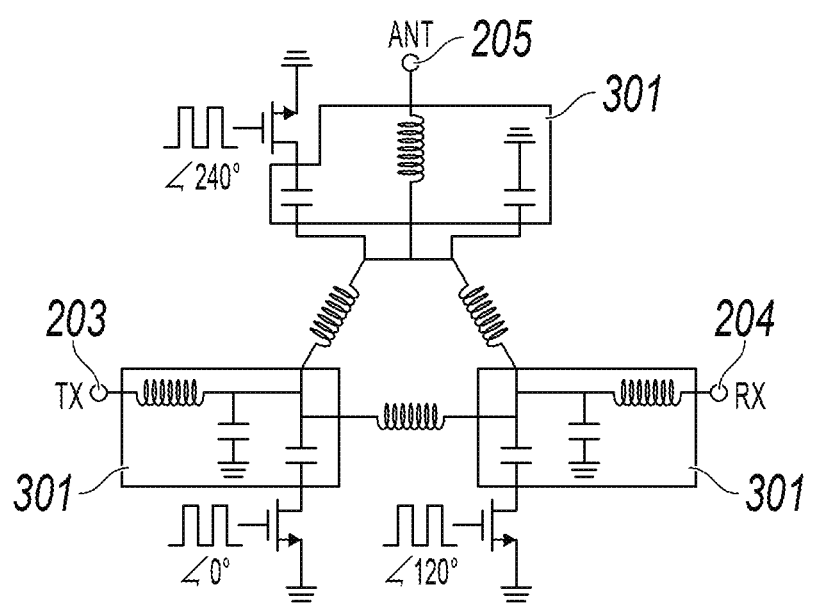
Figure 13B:
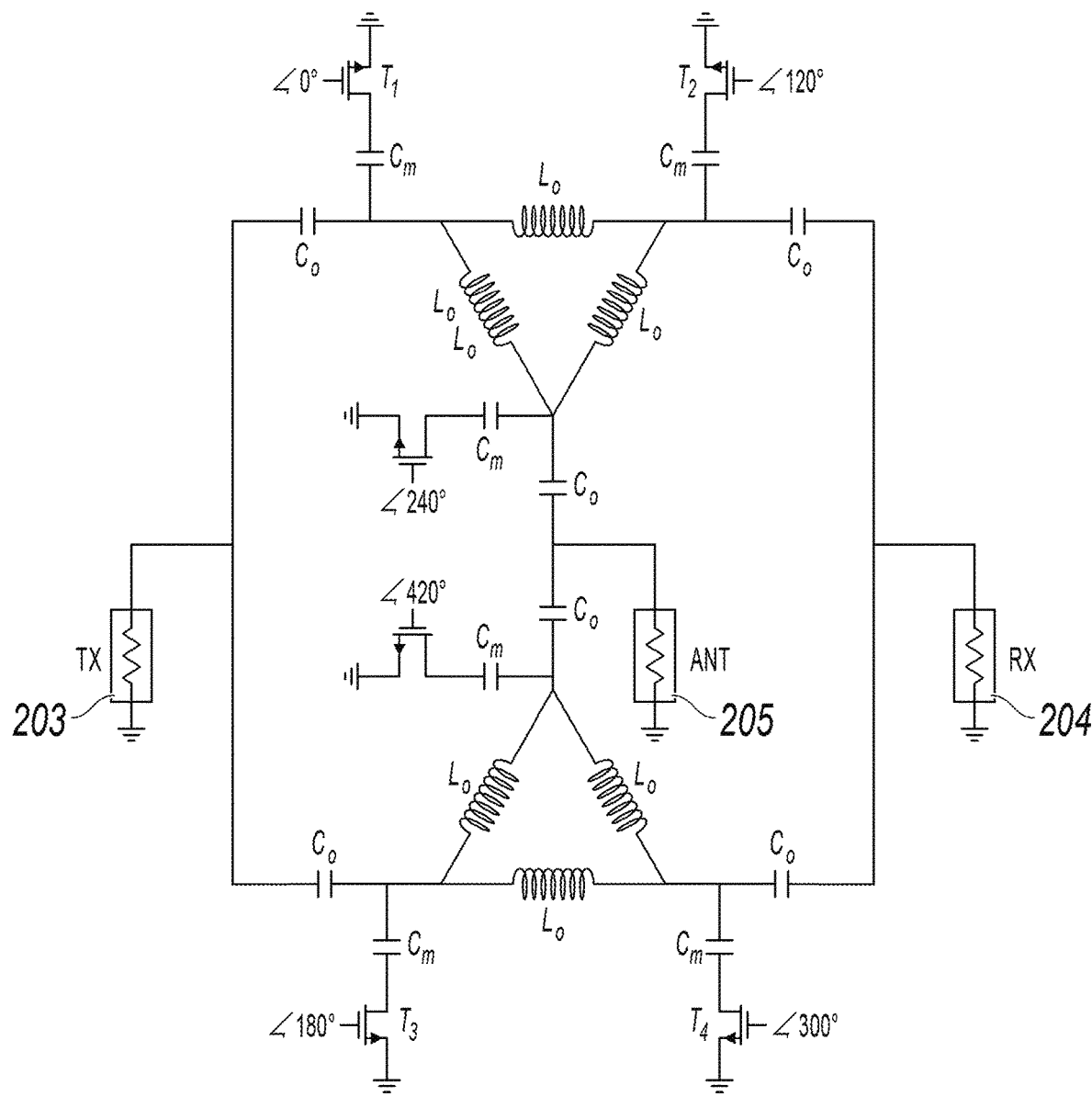
Figure 14A:
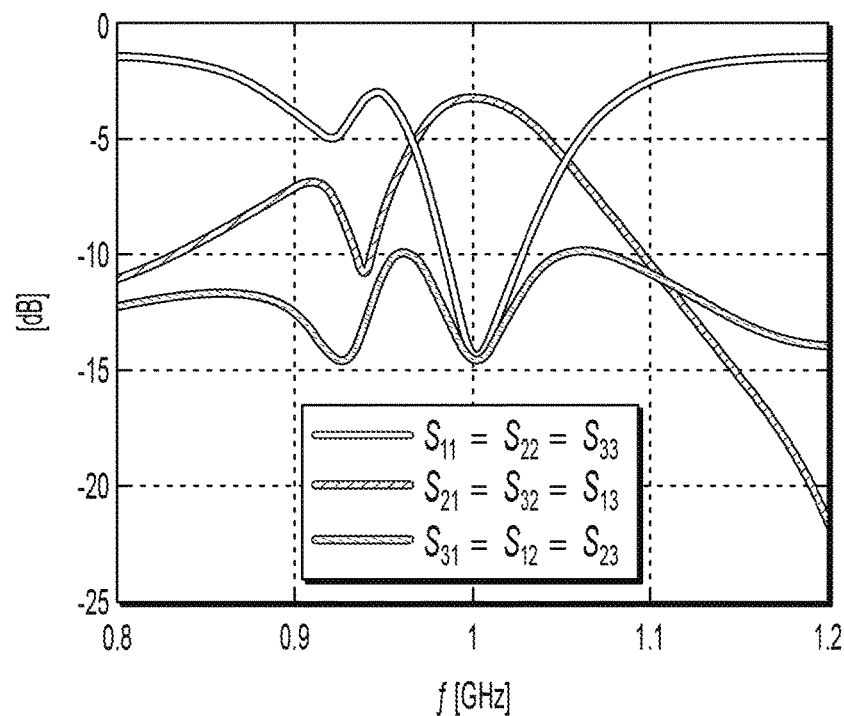
Figure 14B:
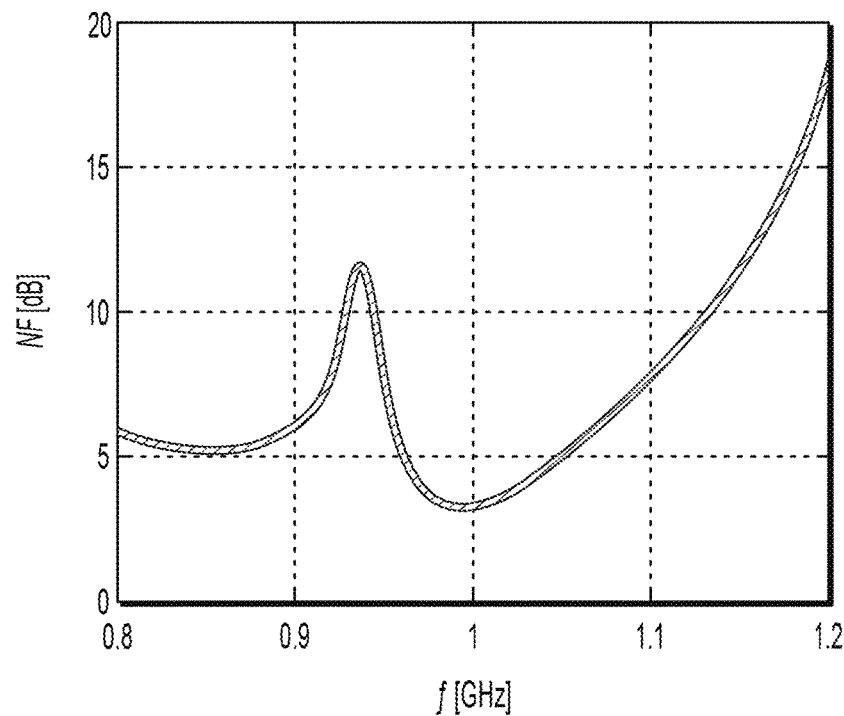
Figure 14C:
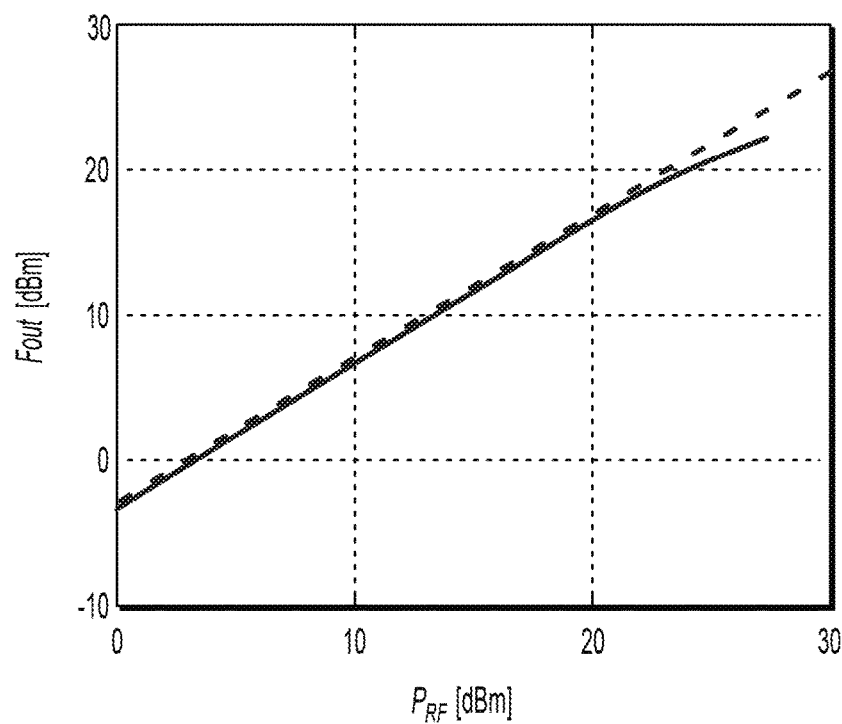
Figure 14D:
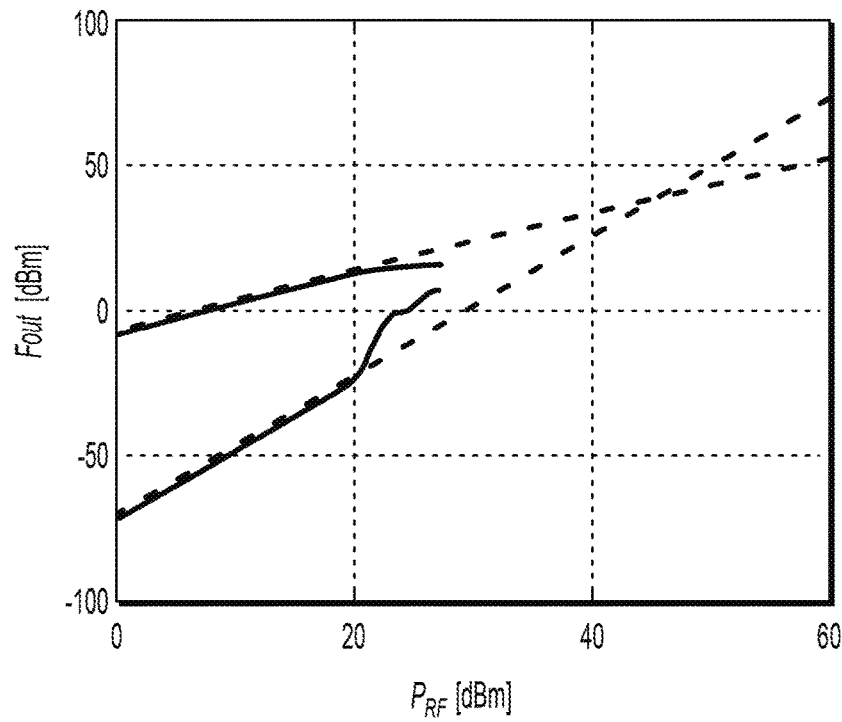
Figure 15A:
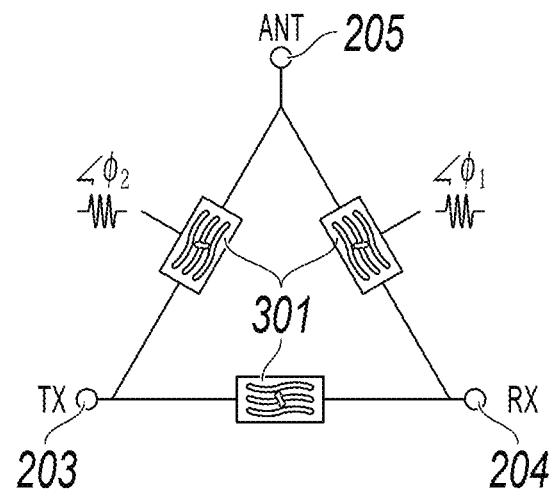
Figure 15B:
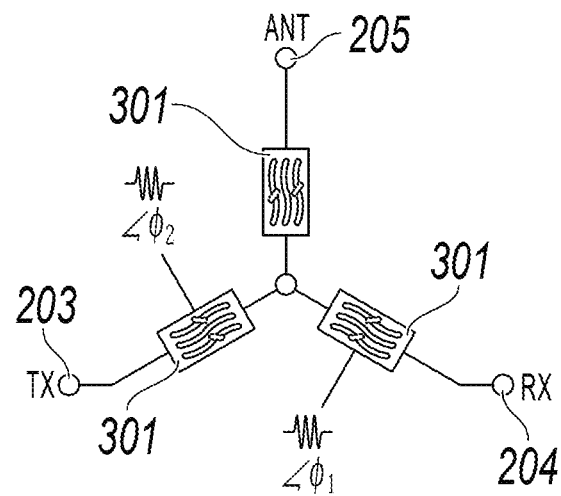
Figure 15C:
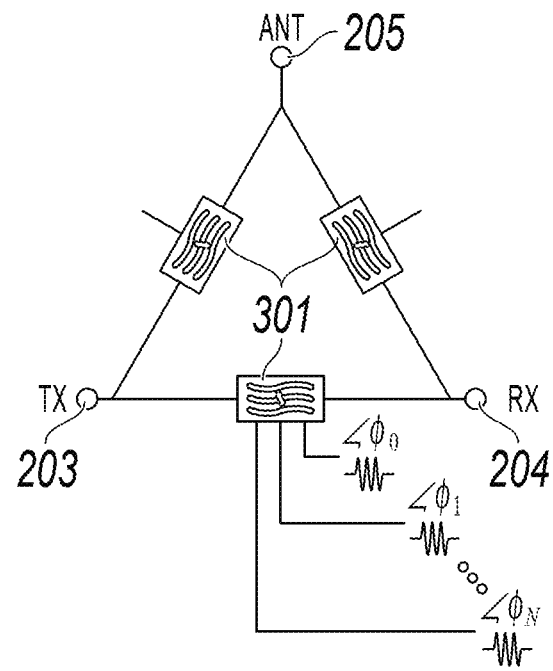
Figure 15D:
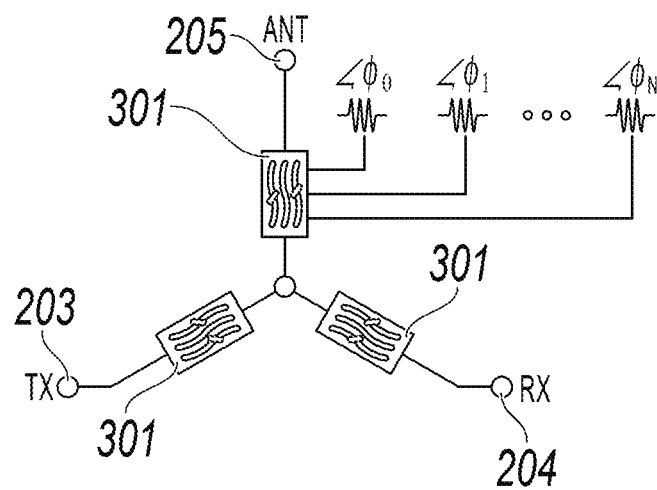
Figure 17C:
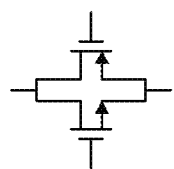
Figure 17D:
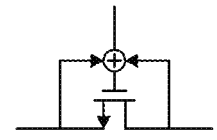
Figure 17E:
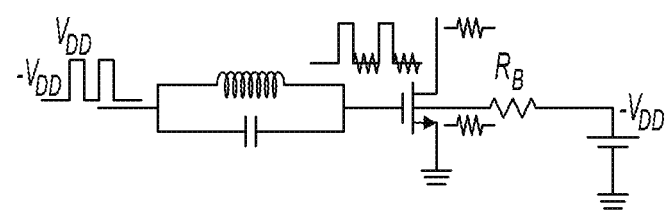
Figure 18:
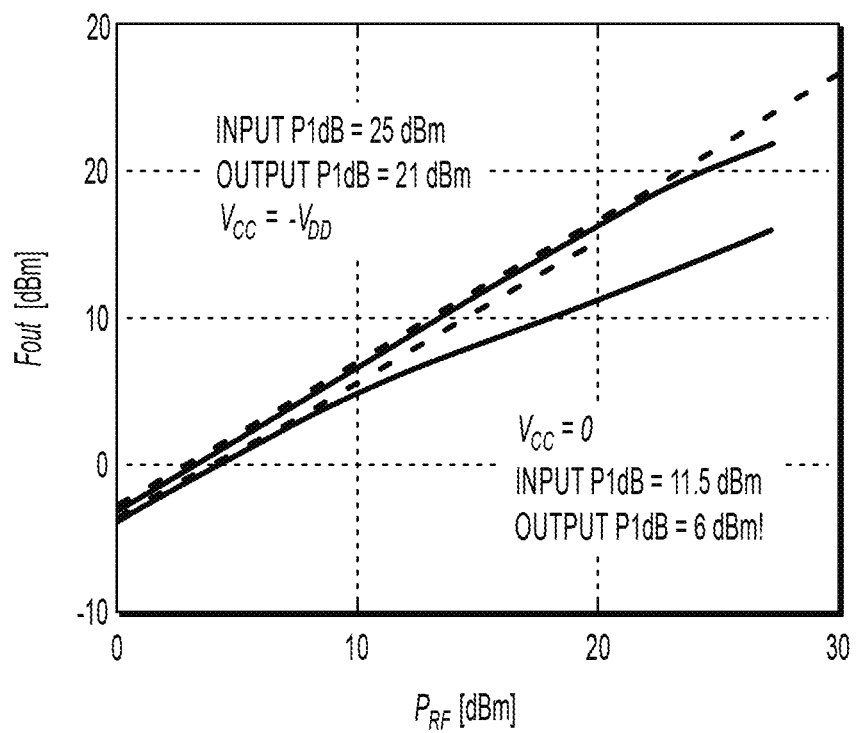
Figure 19:
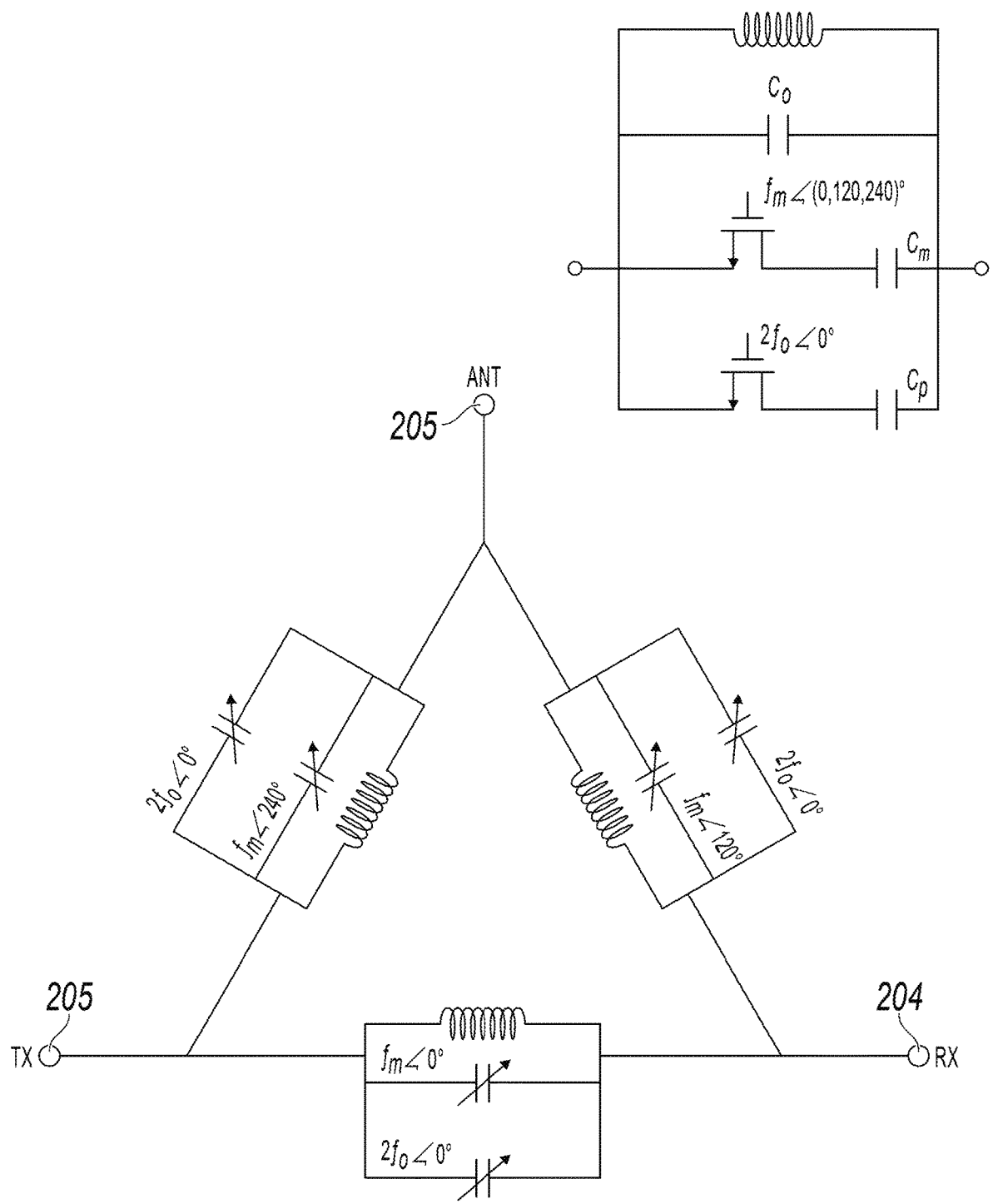
Figure 20A:
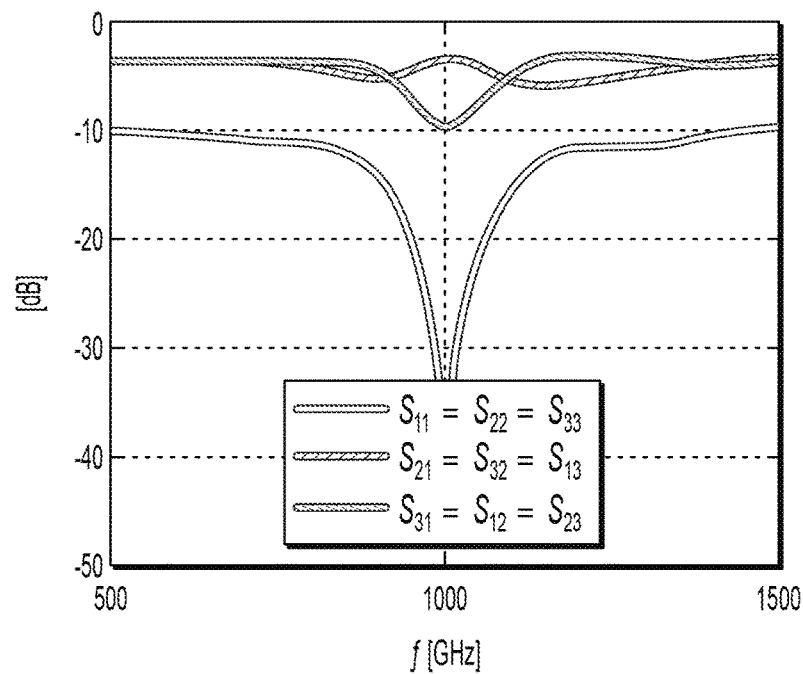
Figure 20B:
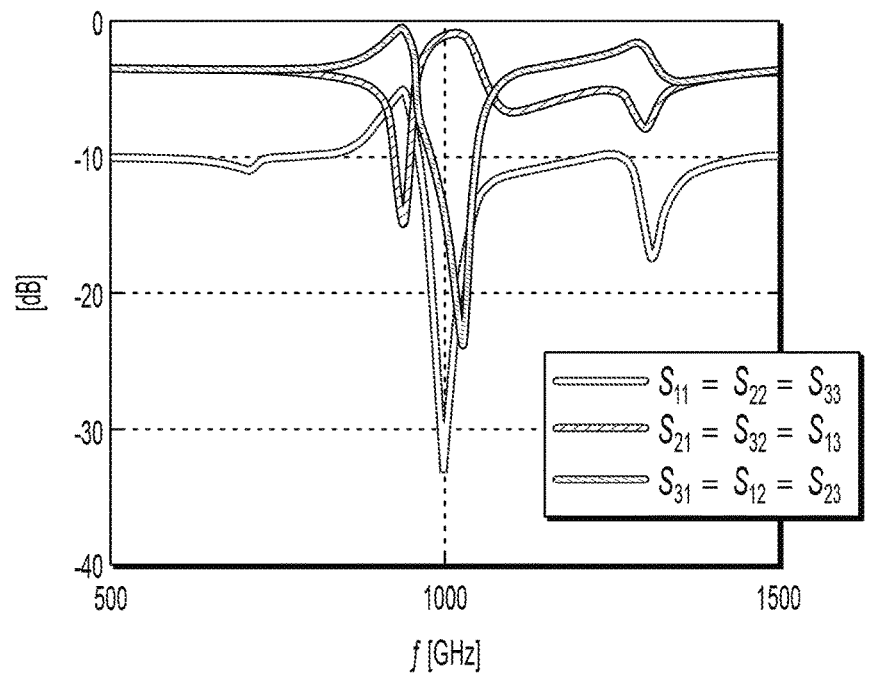
Figure 21A:
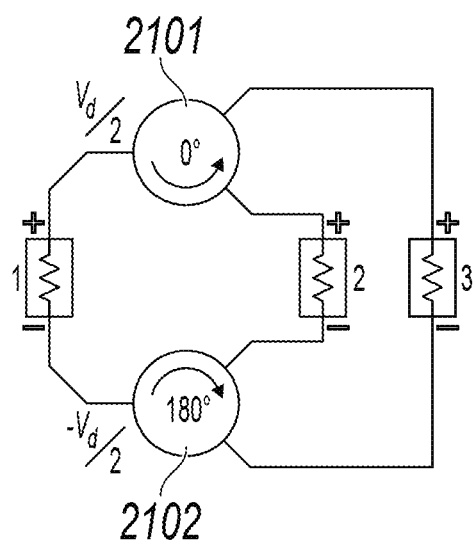
Figure 21B:
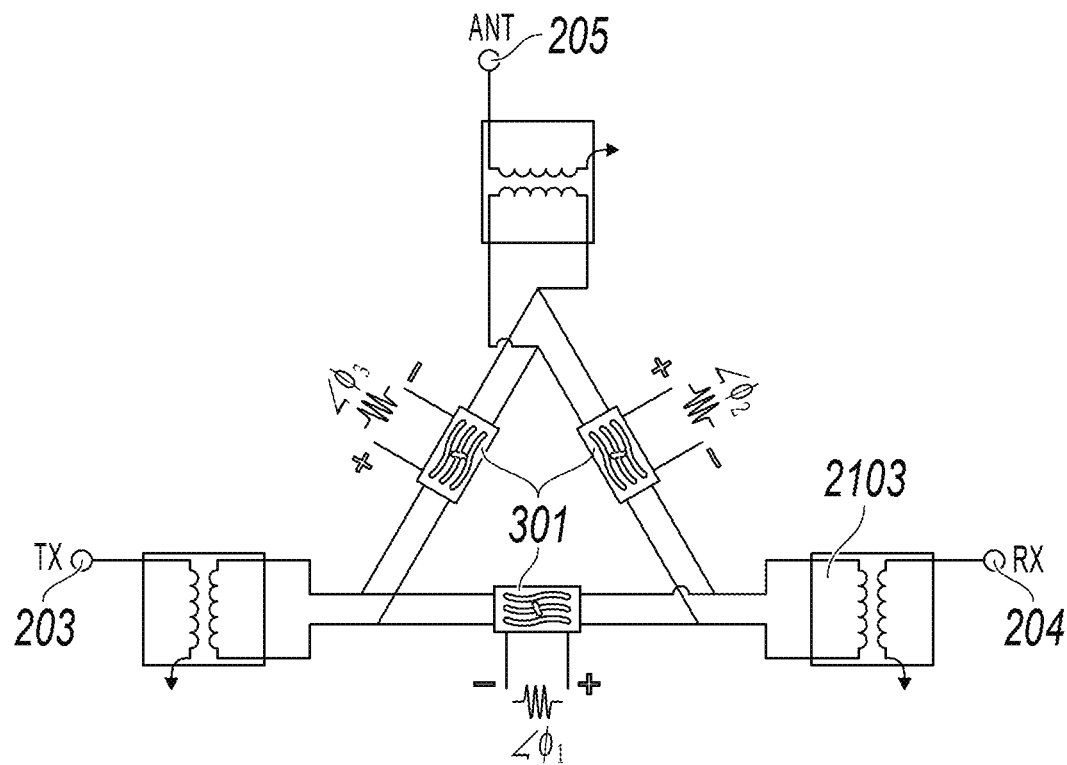
Figure 21C:
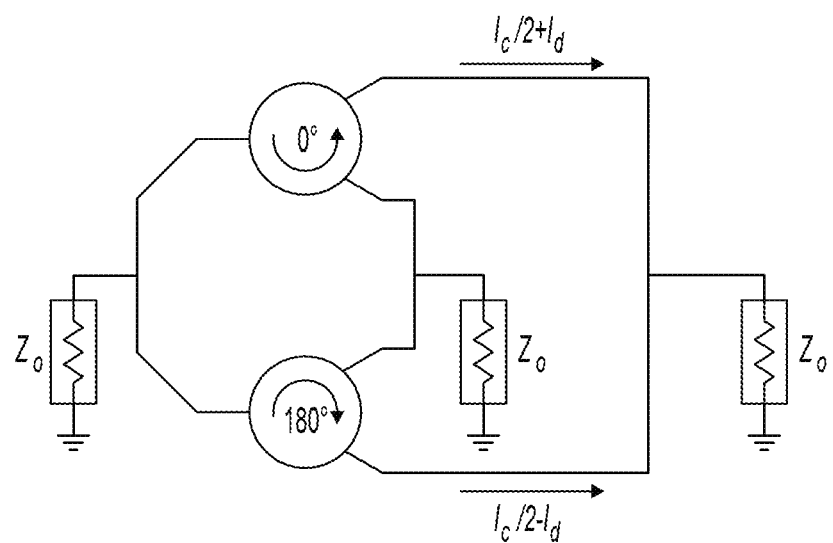
Figure 22A:
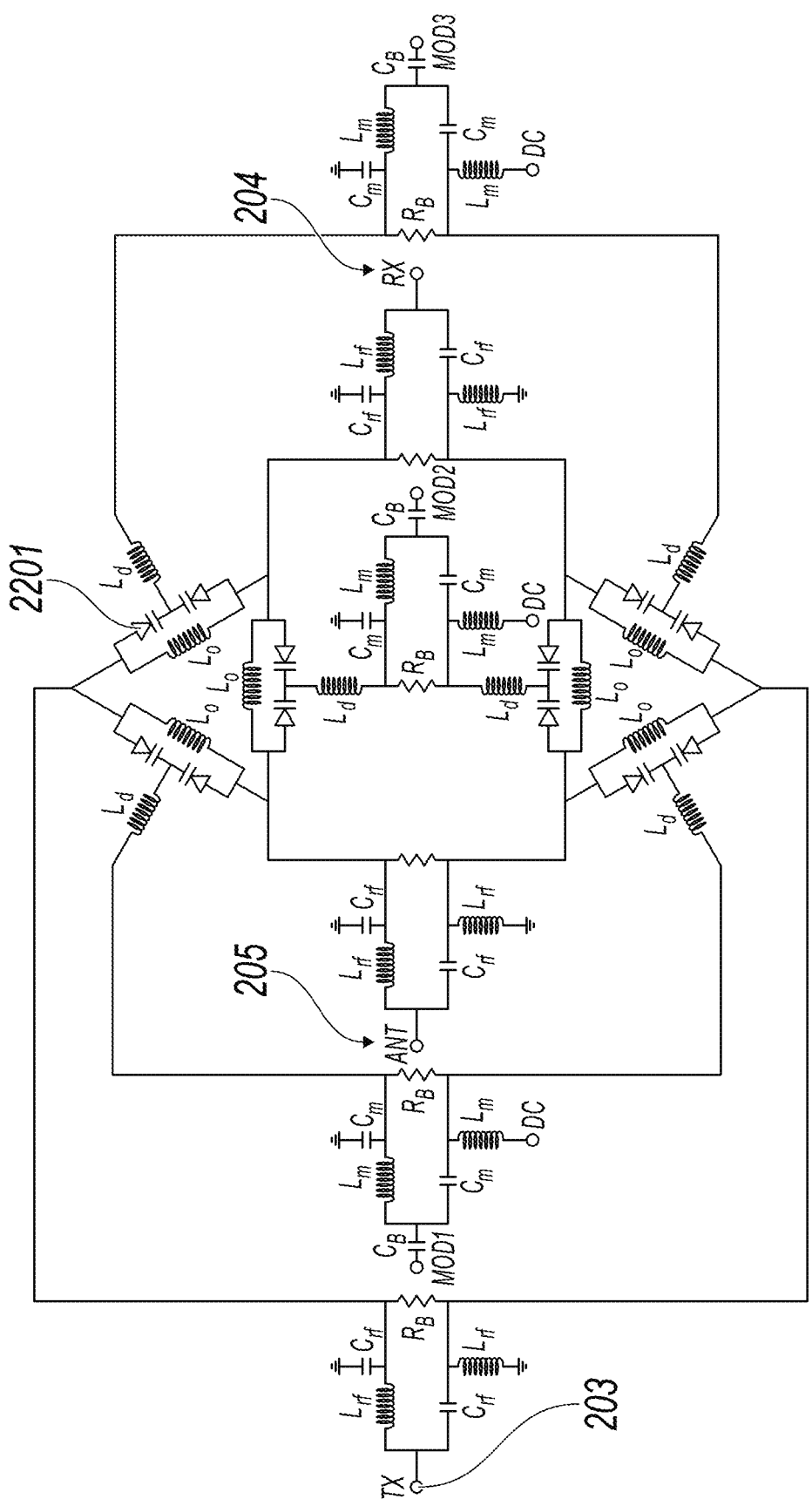
Figure 22B:
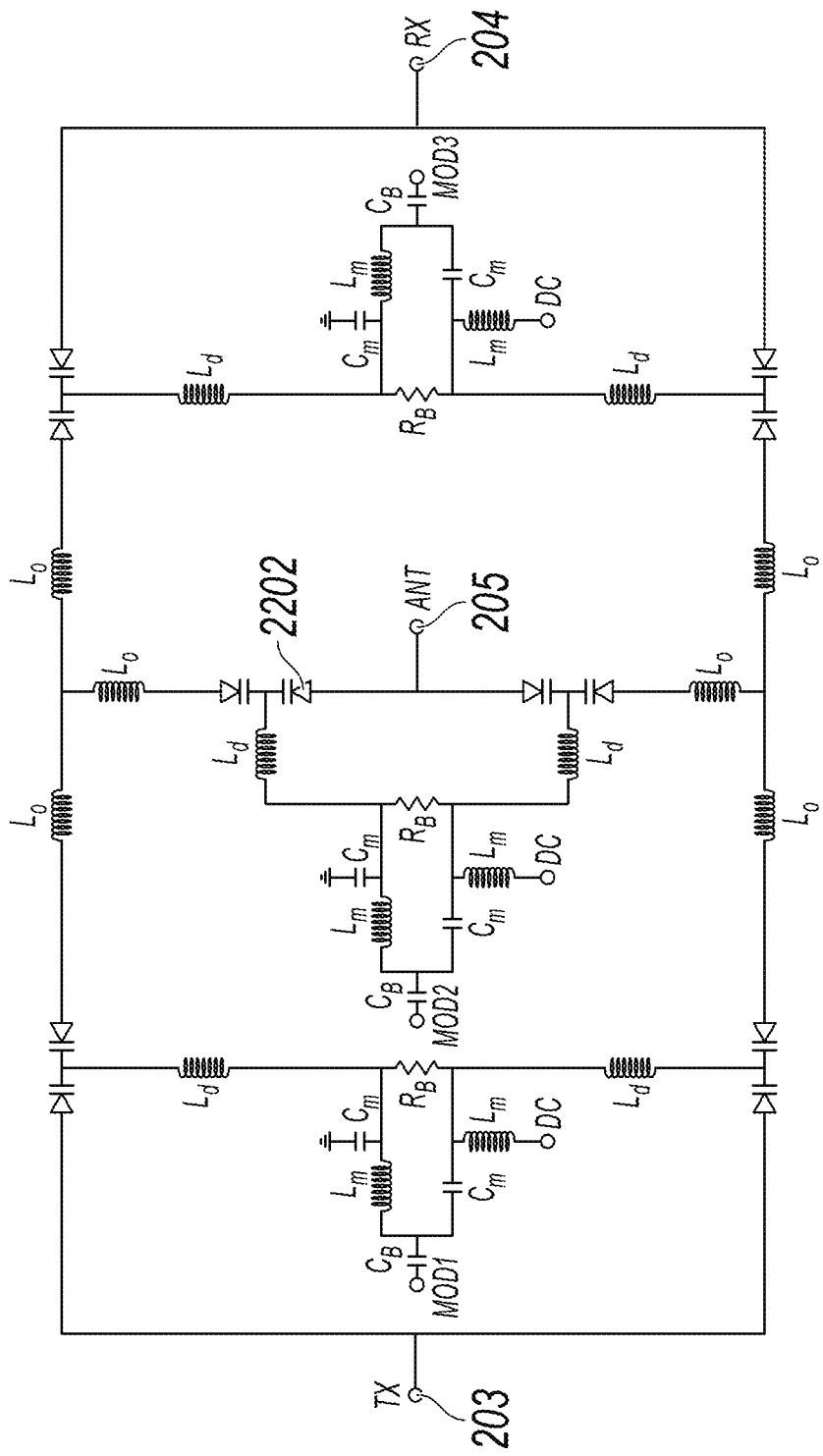
Figure 23:
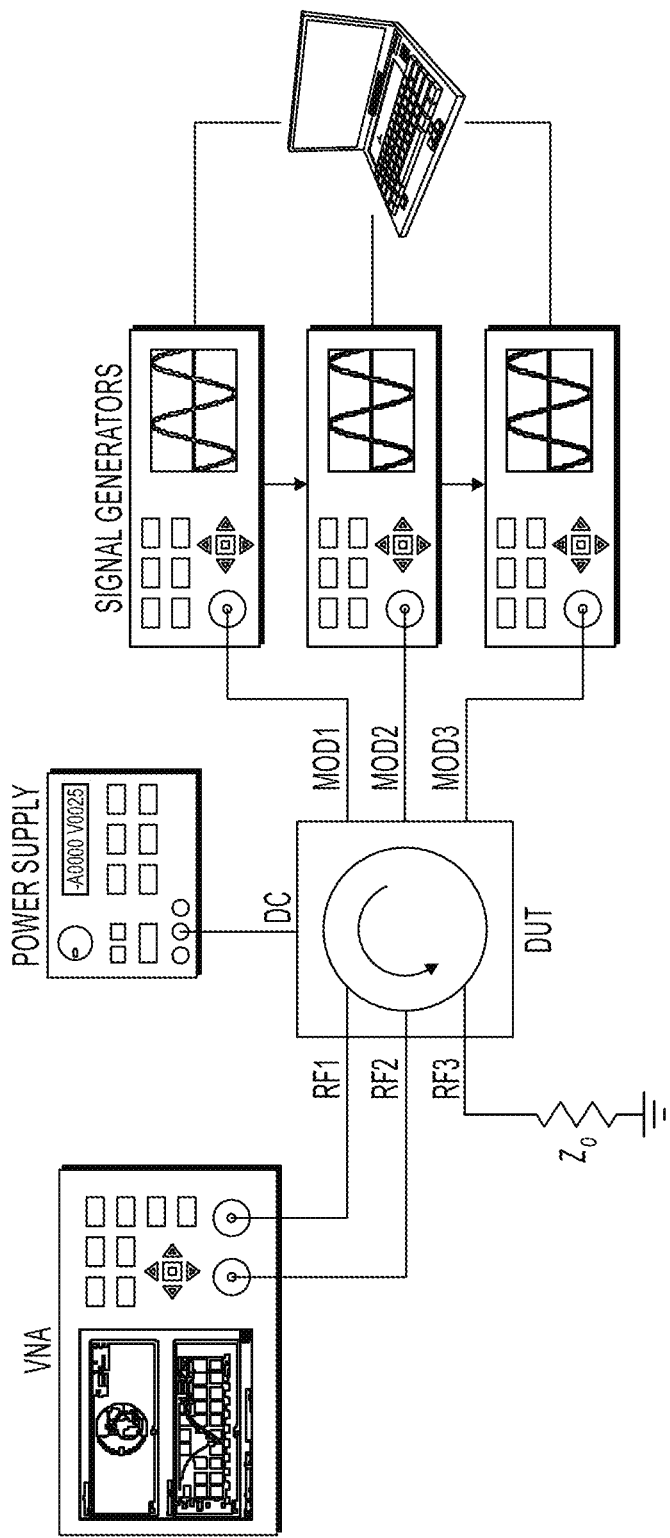
Figure 24A:
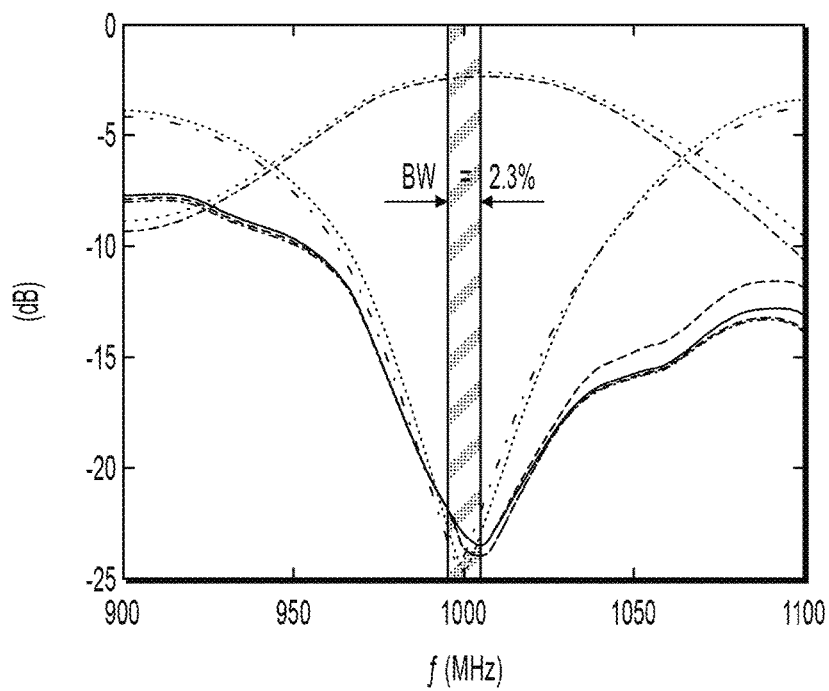
Figure 24A:
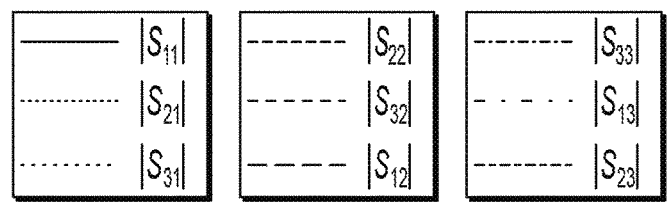
Figure 24B:
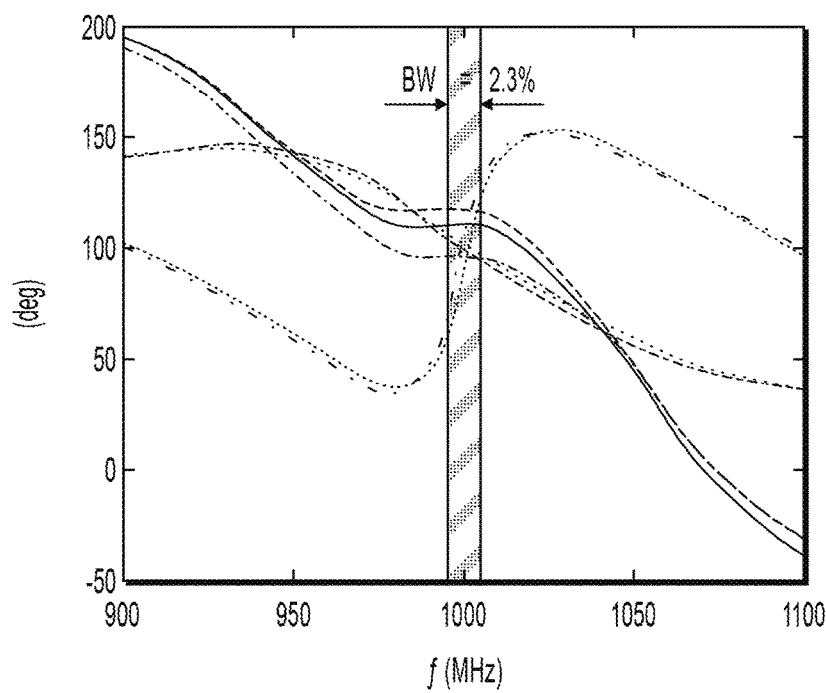
Figure 24B:
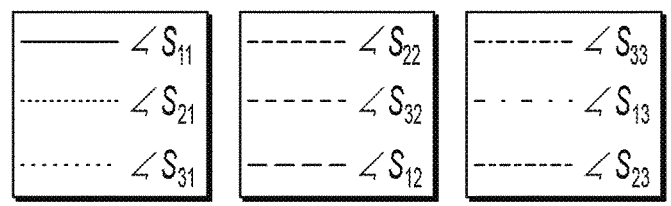
Figure 24C:
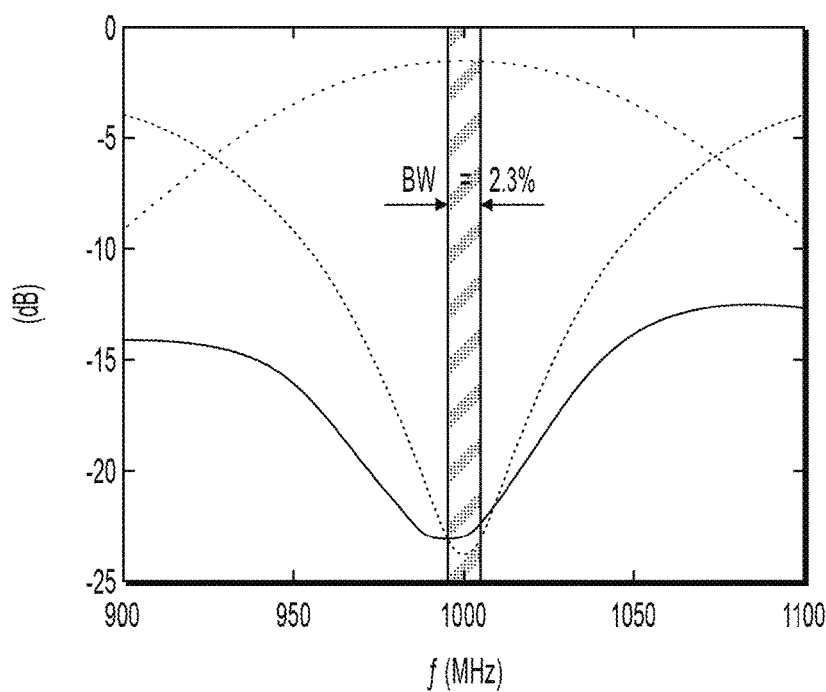
Figure 24D:
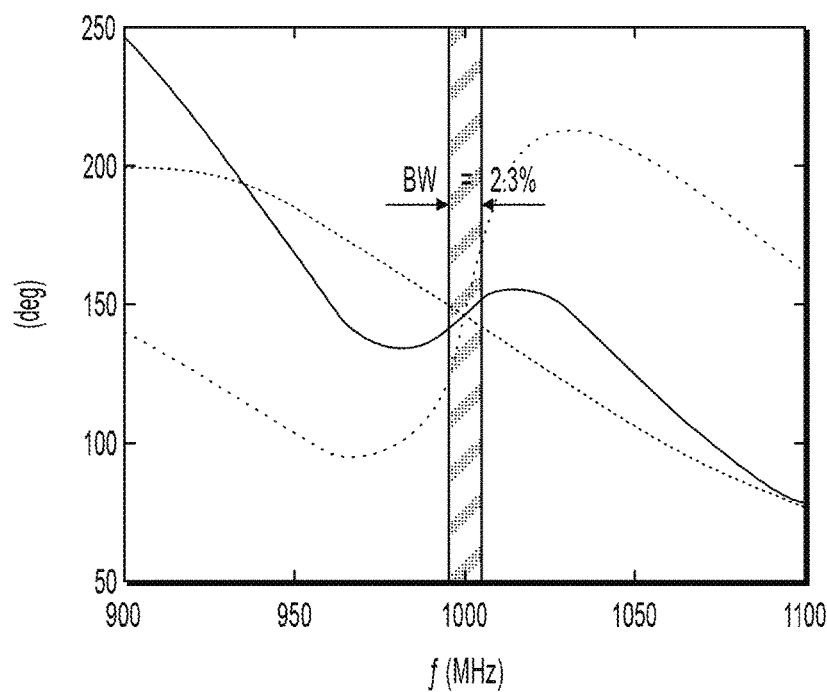
Figure 25A:
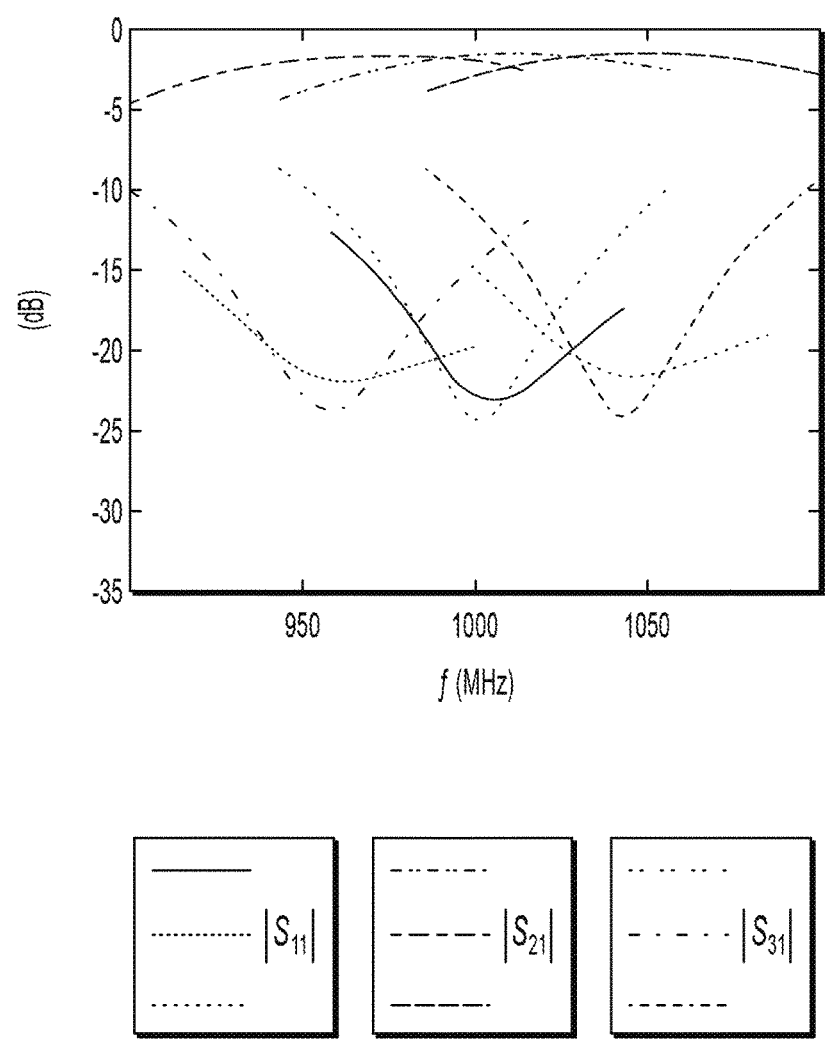
Figure 25B:
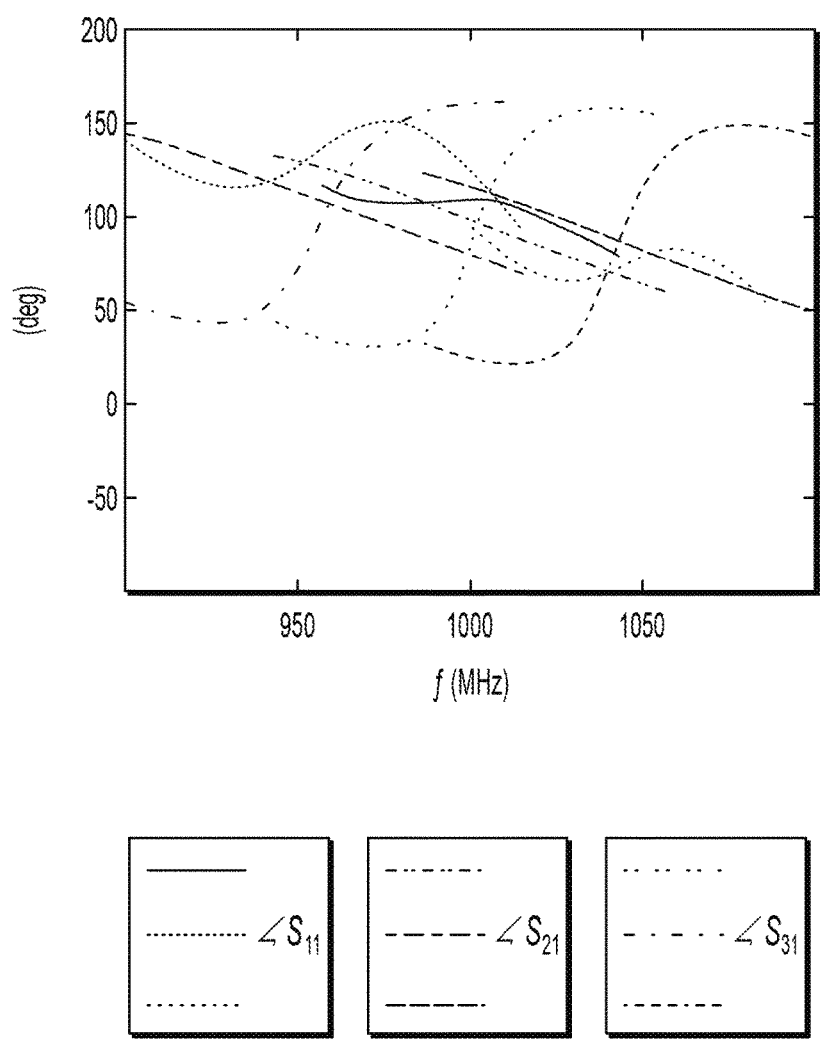
Figure 26A:
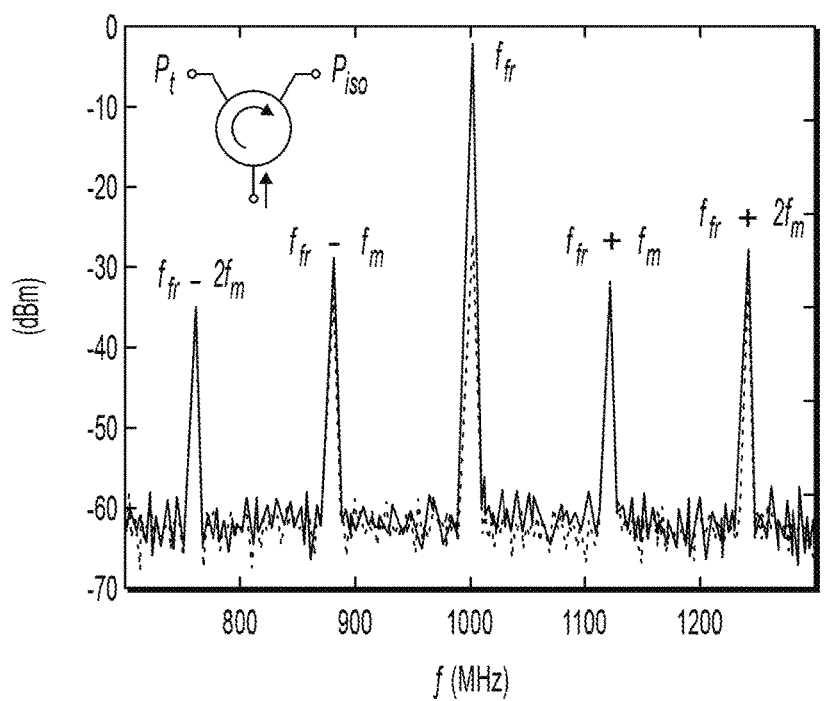
Figure 26B:
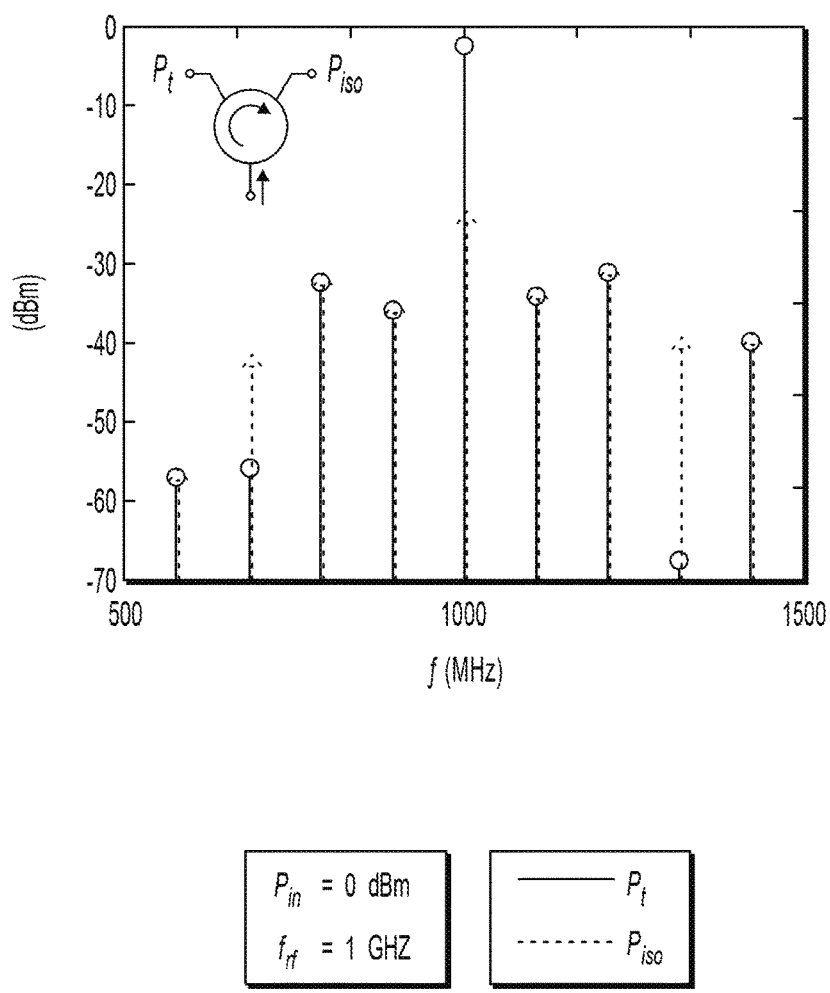
Figure 27A:
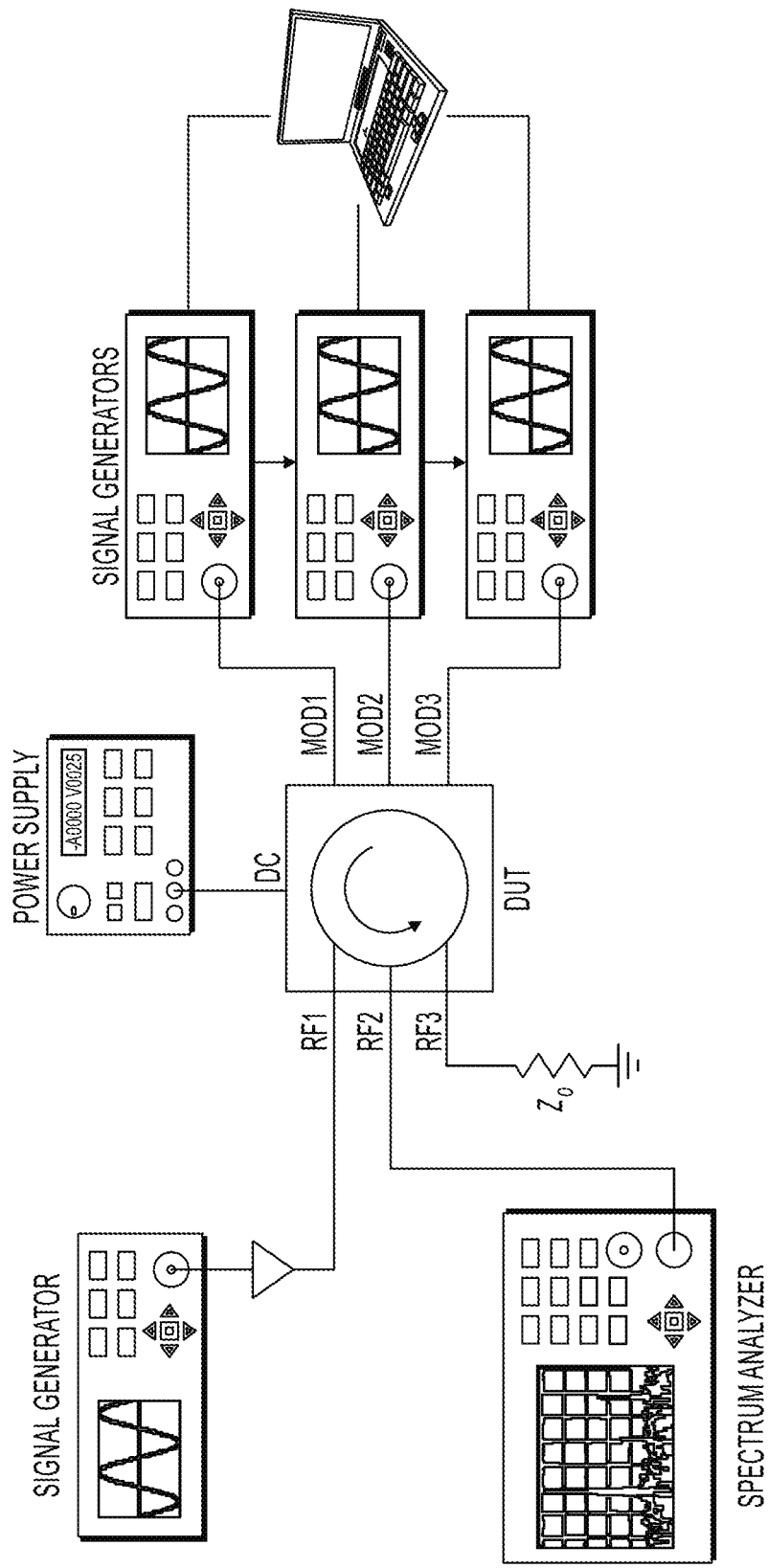
Figure 27B:
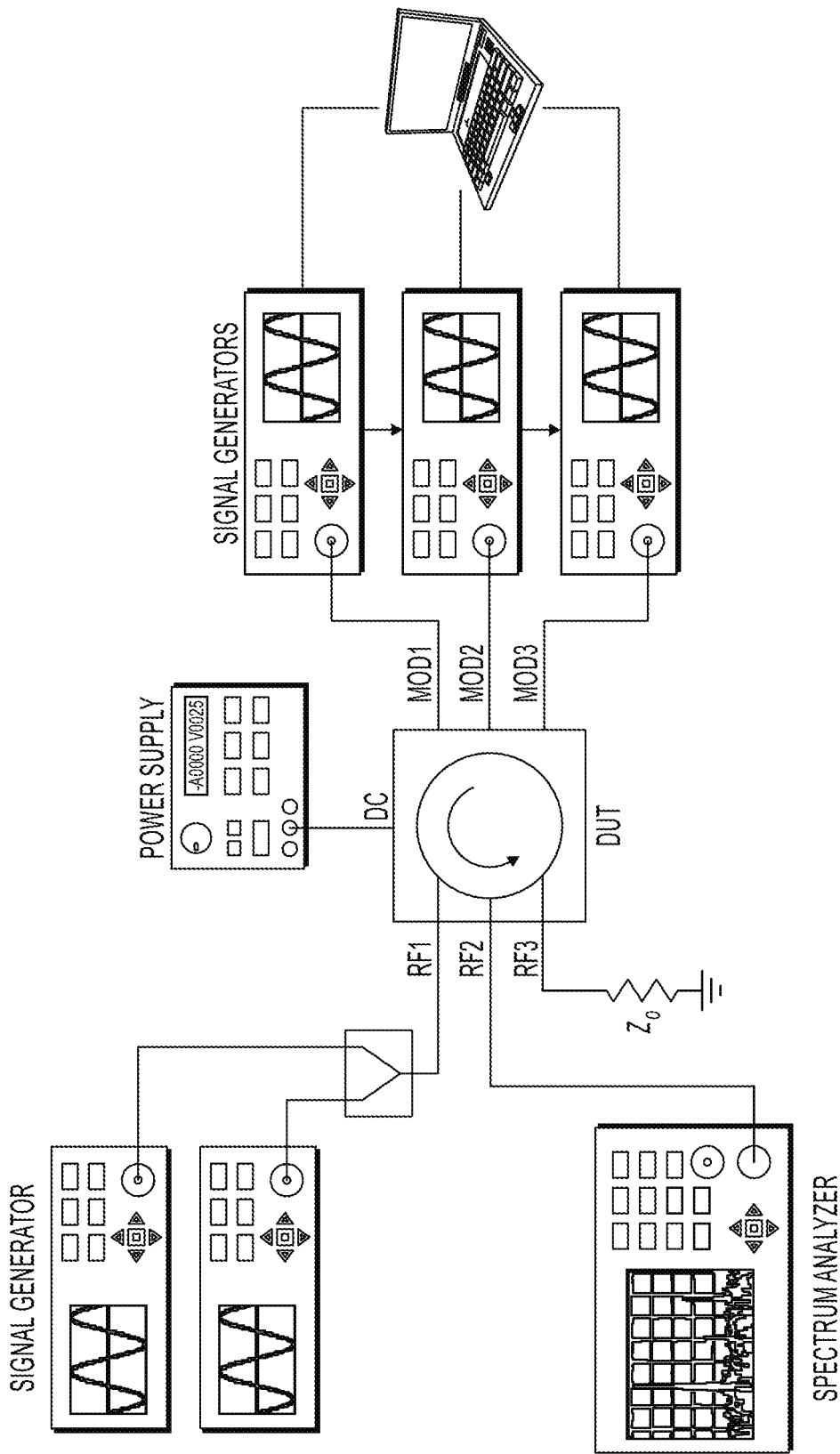
Figure 28:
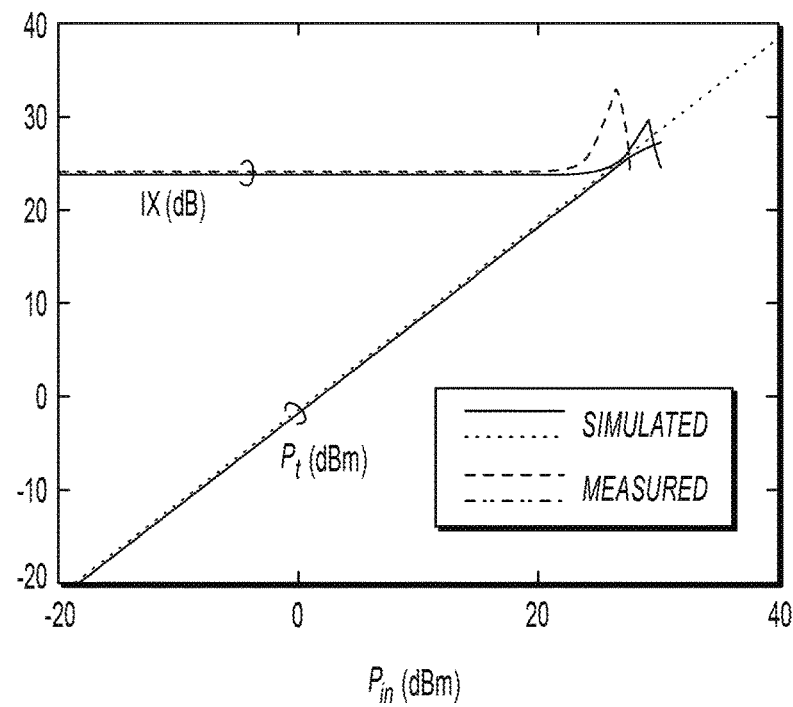
Figure 29:
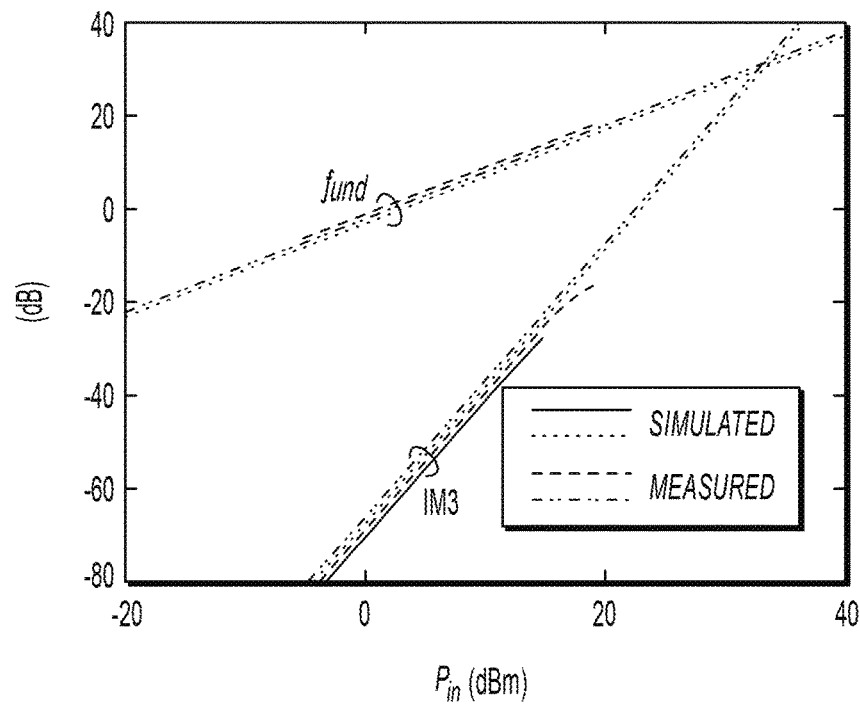
Figure 30:
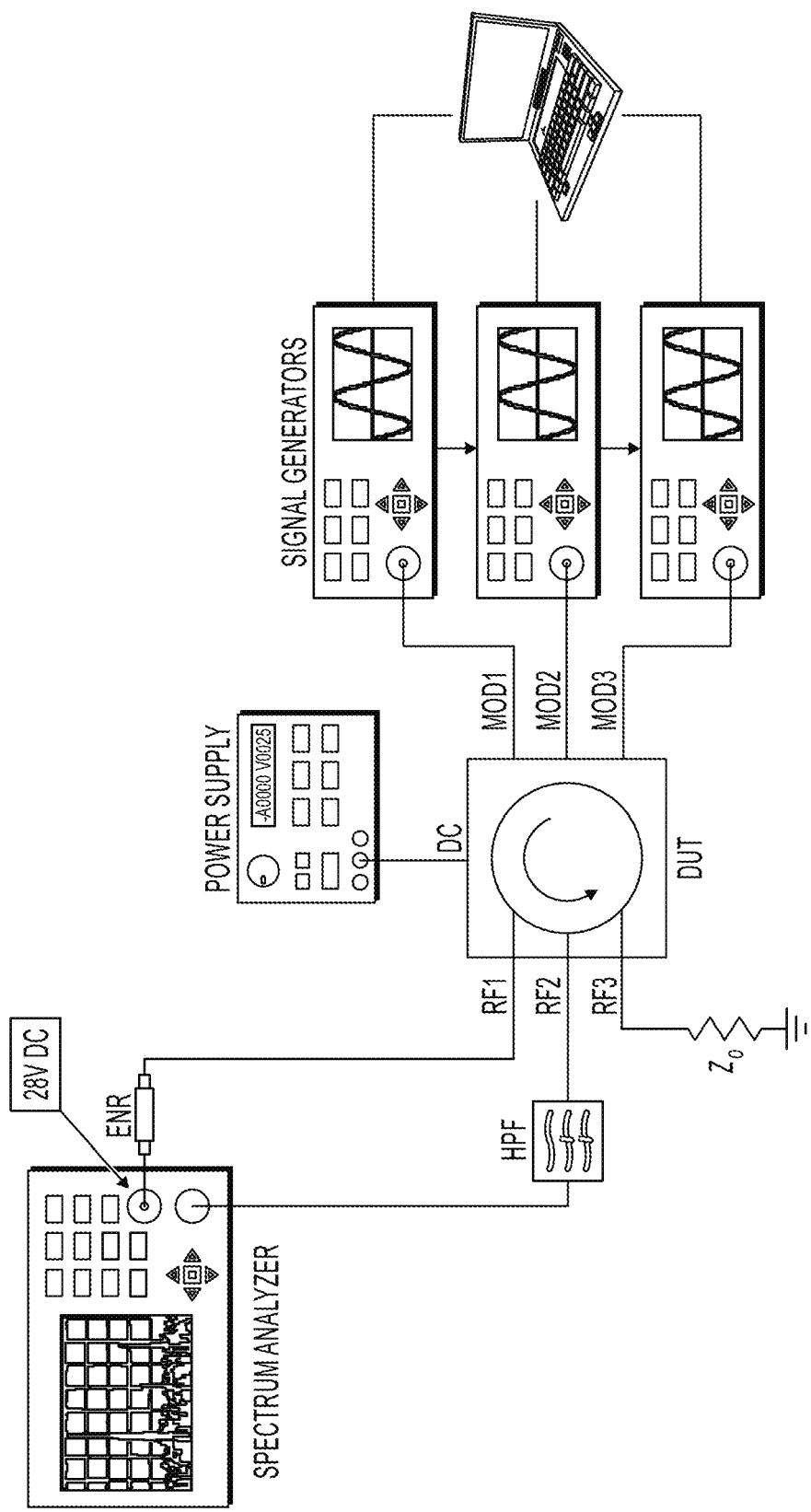
Figure 31:
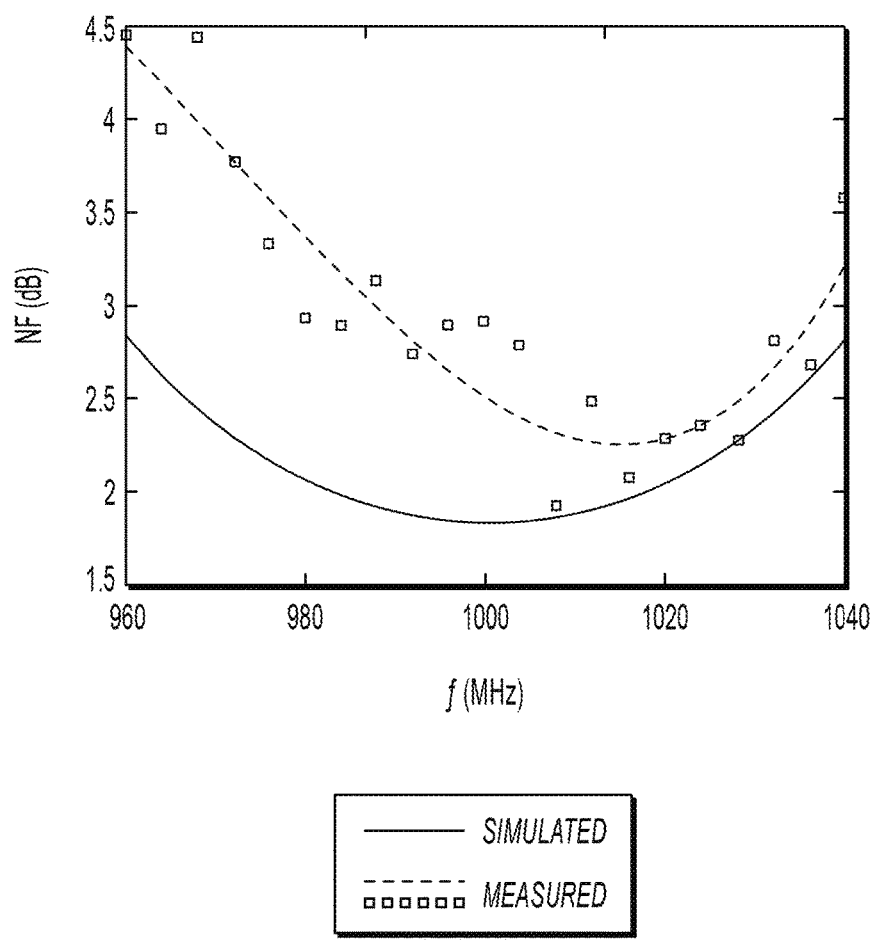
Figure 32A:
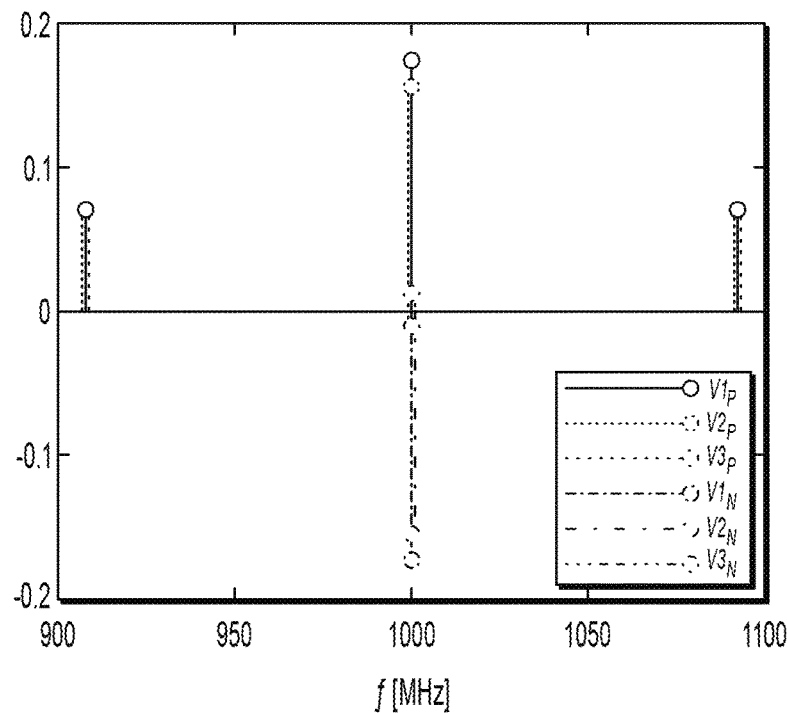
Figure 32B:
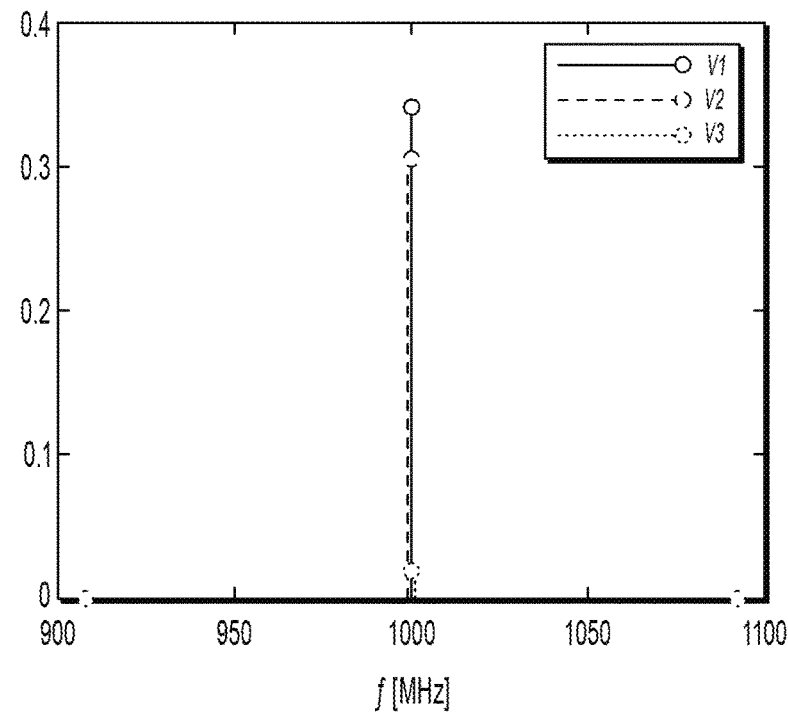
Figure 33:
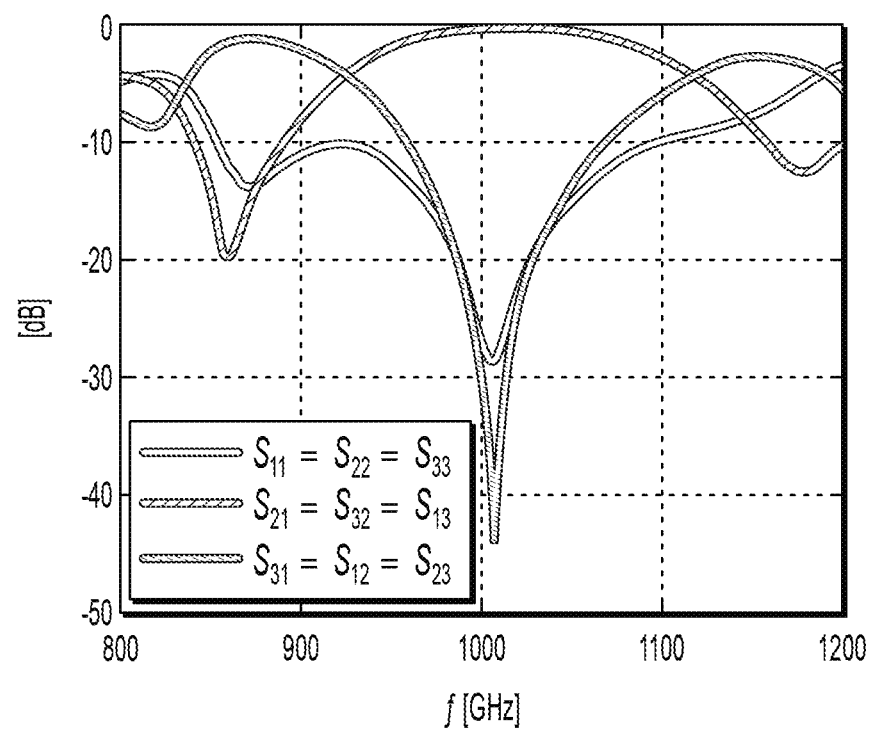
Figure 35A:
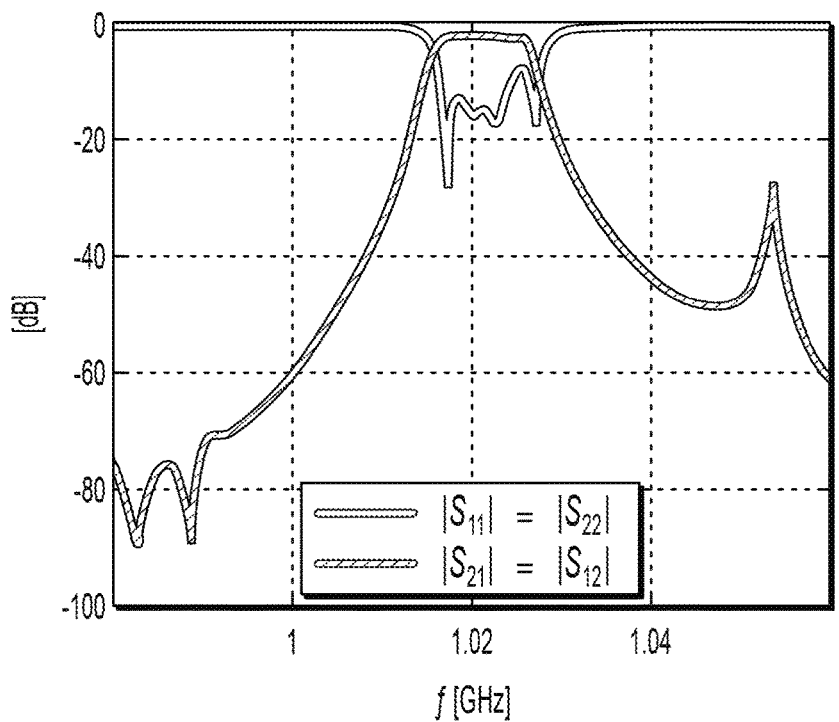
Figure 35B:
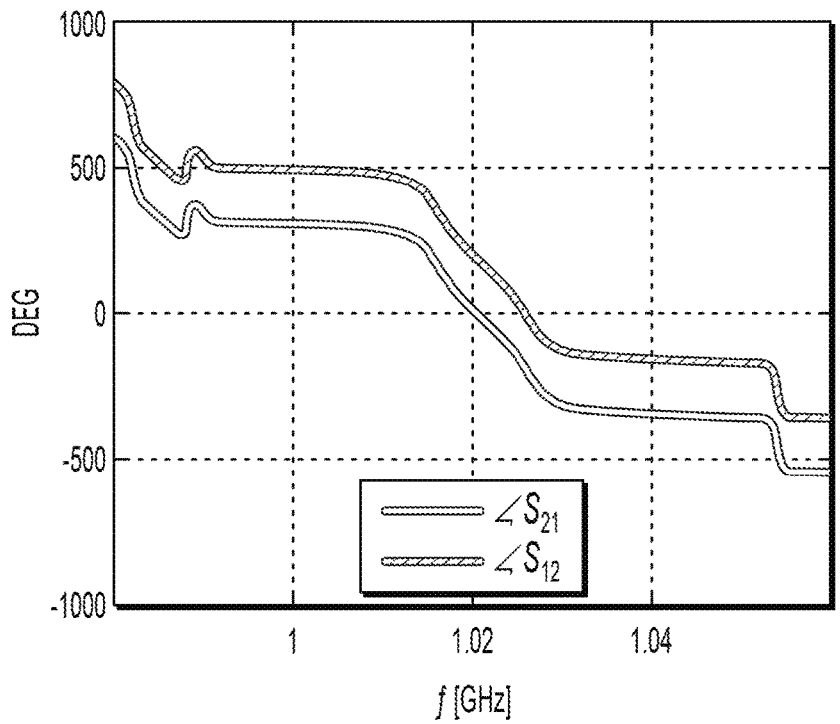

in accordance with an embodiment of the present invention;

FIGS. 7A-7B illustrate the magnitude and phase, respectively, of the simulated S-parameters for the circuit in FIG. 5A on a conventional FR4 board in accordance with an embodiment of the present invention;

FIG. 8 illustrates the simulated gain and isolation compression in accordance with an embodiment of the present invention;

FIG. 9 illustrates the simulated IIP3 for two in-band large signals at 1 MHz offset in accordance with an embodiment of the present invention;

FIG. 10 illustrates the simulate noise figure (NF) in the receiver path for three channels in accordance with an embodiment of the present invention;

FIG. 11A illustrates a $2^{nd}$ order example using a bandpass star junction in accordance with an embodiment of the present invention;

FIG. 11B illustrates the achieved S-parameters with a bandwidth of about 200 MHz in accordance with an embodiment of the present invention;

FIG. 12A illustrates analog modulation through varactors in accordance with an embodiment of the present invention;

FIG. 12B illustrates digital modulation realized by switching unmodulated filters with different center frequencies in accordance with an embodiment of the present invention;

FIG. 12C illustrates digital modulation realized by switching capacitors or inductors in accordance with an embodiment of the present invention;

FIG. 13A illustrates a $1^{st}$ order "digital" circulator based on a delta junction where filters therein were realized using a (C-L-C) pi-network in accordance with an embodiment of the present invention;

FIG. 13B illustrates an alternative embodiment of the $1^{st}$ order digital circulator based on a differential hybrid topology and digital modulation of bandpass filters in accordance with an embodiment of the present invention;

FIGS. 14A-14D illustrate the simulation results using a 180 nm CMOS PDK for the circuit in FIG. 13A in accordance with an embodiment of the present invention;

FIGS. 15A-15B illustrate modulation being applied asymmetrically to two branches in accordance with an embodiment of the present invention;

FIGS. 15C-15D illustrate modulation being applied asymmetrically to a single branch in accordance with an embodiment of the present invention;

FIG. 16 illustrates the simulation results for the circuit in FIG. 15A in accordance with an embodiment of the present invention;

FIG. 17A illustrates stacking varactors and connecting them in anti-series pairs to increase the compression and 3rd order intercept points in accordance with an embodiment of the present invention;

FIG. 17B illustrates stacking switches in accordance with an embodiment of the present invention;

FIG. 17C illustrates a transmission gate in accordance with an embodiment of the present invention;

FIG. 17D illustrates bootstrapping in accordance with an embodiment of the present invention;

FIG. 17E illustrates a floating body and gate and using a negative bias in accordance with an embodiment of the present invention;

FIG. 18 illustrates the improvement in power handling for the circuit in FIG. 13A due to floating the body and gate of its CMOS switches and using a clock with a negative rail supply in accordance with an embodiment of the present invention;

FIG. 19 illustrates the parametric gain using an additional in-phase modulation signal at twice the operation frequency in accordance with an embodiment of the present invention;

FIGS. 20A-20B illustrate the comparison between the S-parameters of a lossy circulator without and with parametric gain, respectively, in accordance with an embodiment of the present invention;

FIG. 21A illustrates a differential circulator using two circulators in accordance with an embodiment of the present invention;

FIG. 21B illustrates a differential circulator using a single circulator with differential filters in accordance with an embodiment of the present invention;

FIG. 21C illustrates a differential current-mode circulator using two single-ended circulators and single-ended ports in accordance with an embodiment of the present invention;

FIG. 22A illustrates an example for a detailed circuit implementation of FIG. 21A which includes two single-ended circulators based on delta topology and bandstop filters in accordance with an embodiment of the present invention;

FIG. 22B illustrates an example for a detailed circuit implementation of FIG. 21C which includes two single-ended circulators based on wye topology and bandpass filters in accordance with an embodiment of the present invention;

FIG. 23 illustrates the experimental setup for measuring S-parameters in accordance with an embodiment of the present invention;

FIGS. 24A-24B illustrate the S-parameters measured in accordance with an embodiment of the present invention;

FIGS. 24C-24D illustrates the S-parameters simulated in accordance with an embodiment of the present invention;

FIG. 25A illustrates the magnitude of the measured S-parameters at different channels by changing the DC bias and modulation voltage in accordance with an embodiment of the present invention;

FIG. 25B illustrates the phase of the measured S-parameters at different channels by changing the DC bias and modulation voltage in accordance with an embodiment of the present invention;

FIG. 26A illustrates the measured harmonic spectrum at the transmitted and isolated ports for a single tone input at $f_{rf}$=1 GHz and $P_{in}$=0 dBm in accordance with an embodiment of the present invention;

FIG. 26B illustrates the simulated harmonic spectrum at the transmitted and isolated ports for a single tone input at $f_{rf}$=1 GHz and $P_{in}$=0 dBm in accordance with an embodiment of the present invention;

FIGS. 27A and 27B illustrate the experimental setup of P1 dB and IIP3 measurements, respectively, in accordance with an embodiment of the present invention;

FIG. 28 illustrates the measured and simulated P1 dB and maximum power handling in accordance with an embodiment of the present invention;

FIG. 29 illustrates the measured and simulated IIP3 in accordance with an embodiment of the present invention;

FIG. 30 illustrates the experimental setup of NF measurement in accordance with an embodiment of the present invention;

FIG. 31 illustrates the measured and simulated NF in accordance with an embodiment of the present invention FIGS. 32A-32B illustrate the differential harmonic calculator harmonic response for excitation at the $1^{st}$ port, where $v_{i+}$, $v_{i-}$ are the single-ended voltages of the positive and negative terminals, respectively, and $v_i=v_{i+}-v_{i-}$ is the differential voltage at the $i^{th}$ port in accordance with an embodiment of the present invention;

FIG. 33 illustrates the S-parameters for a differential design using two $1^{st}$ order bandstop delta circulators with inductors' Q of 100 as assumed in other designs, where insertion loss is less than 0.5 dB and return loss is more than 25 dB, in accordance with an embodiment of the present invention;

FIG. 34A illustrates modulating the coupling between two bandpass filters with a shifted center frequency in accordance with an embodiment of the present invention;

FIG. 34B illustrates connecting two of the mixers with a phase shift between the modulation frequencies leading to a non-reciprocal phase shifter in accordance with an embodiment of the present invention; and FIGS. 35A-35B illustrate the simulation results for a gyrator using the circuit in FIG. 34B in accordance with an embodiment of the present invention.

DETAILED DESCRIPTION

Figure 1:
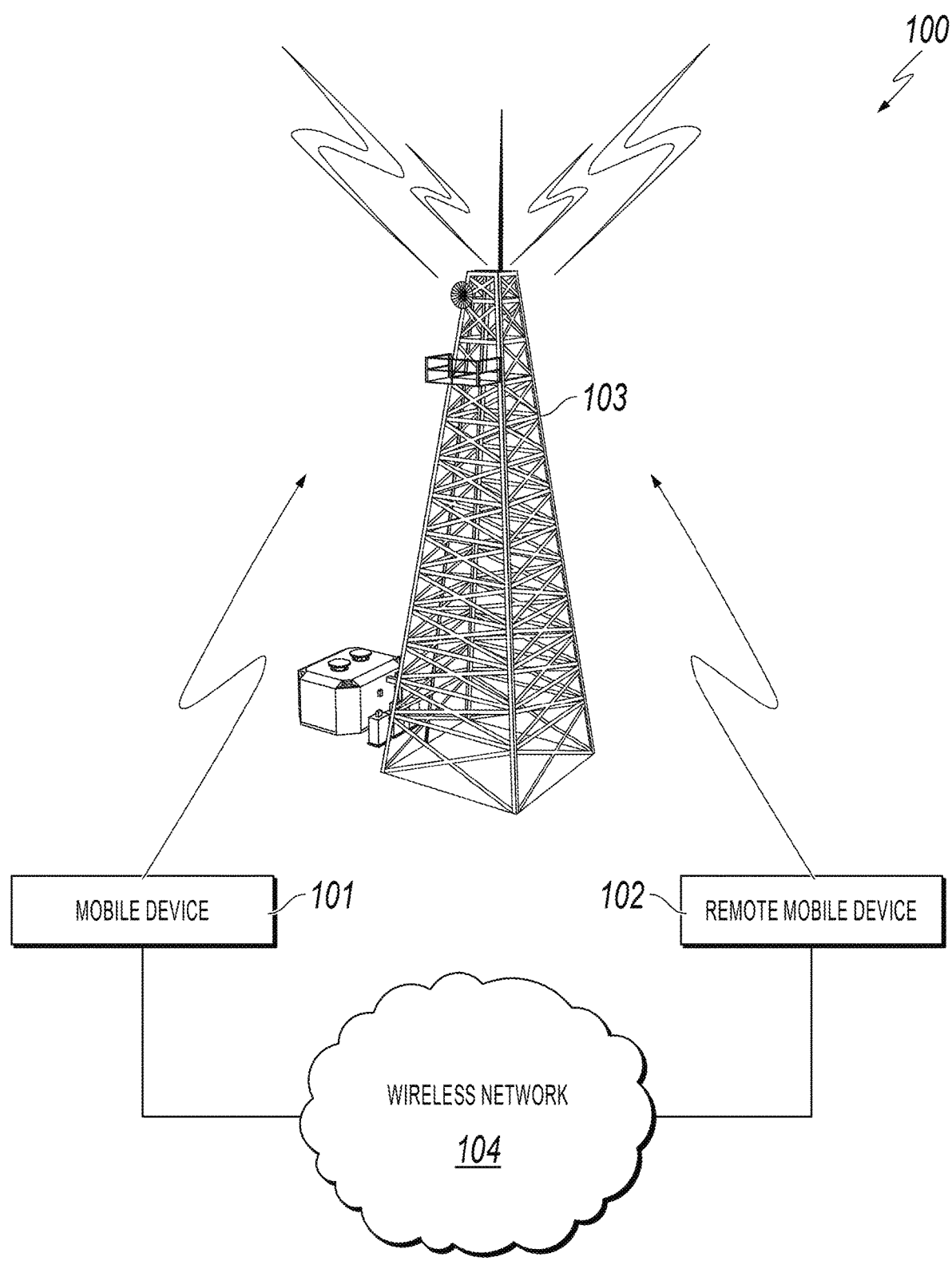
FIG. 1 illustrates a communication system configured in accordance with an embodiment of the present invention.

Referring now to the Figures in detail, FIG. 1 illustrates a communication system 100 configured in accordance with an embodiment of the present invention. Referring to FIG. 1, communication system 100 includes a mobile computing device 101 (also referred to herein as simply "mobile device") in communication with a remote mobile computing device 102 (also referred to herein as simply "remote mobile device") via a cellular communications network 103 (also referred to herein as "cellular data network") or via a wireless network 104 (e.g., Wi-Fi network).

Mobile devices 101, 102 may be any mobile computing device (e.g., mobile phone, cellular phone, smartphone, personal digital assistance (PDA), portable computing unit, and the like) configured with the capability of receiving voice communications over cellular data network 103 or over wireless network 104. Each mobile device 101, 102 is configured with the capability of initiating or receiving a telephone call over cellular data network 103 or over wireless network 104. The term "remote" as used in connection with mobile device 102 is used to indicate the mobile device of the second user or party that is engaged in a telephone conversation with the user of mobile device 101. For example, the user of mobile device 101 may be initiating or receiving a telephone call from a user (e.g., friend) of mobile device 102. A description of the hardware configuration of mobile devices 101, 102 is provided below in connection with FIGS. 2A-2B.

Wireless network 104 may be, for example, a Wi-Fi network, an IEEE 802.11 standards network, etc., with the capability of delivering voice communications using voice over Internet protocol.

System 100 is not to be limited in scope to any one particular network architecture. System 100 may include any number of mobile devices 101, 102, cellular networks 103 and wireless networks 104.

Figure 2A:
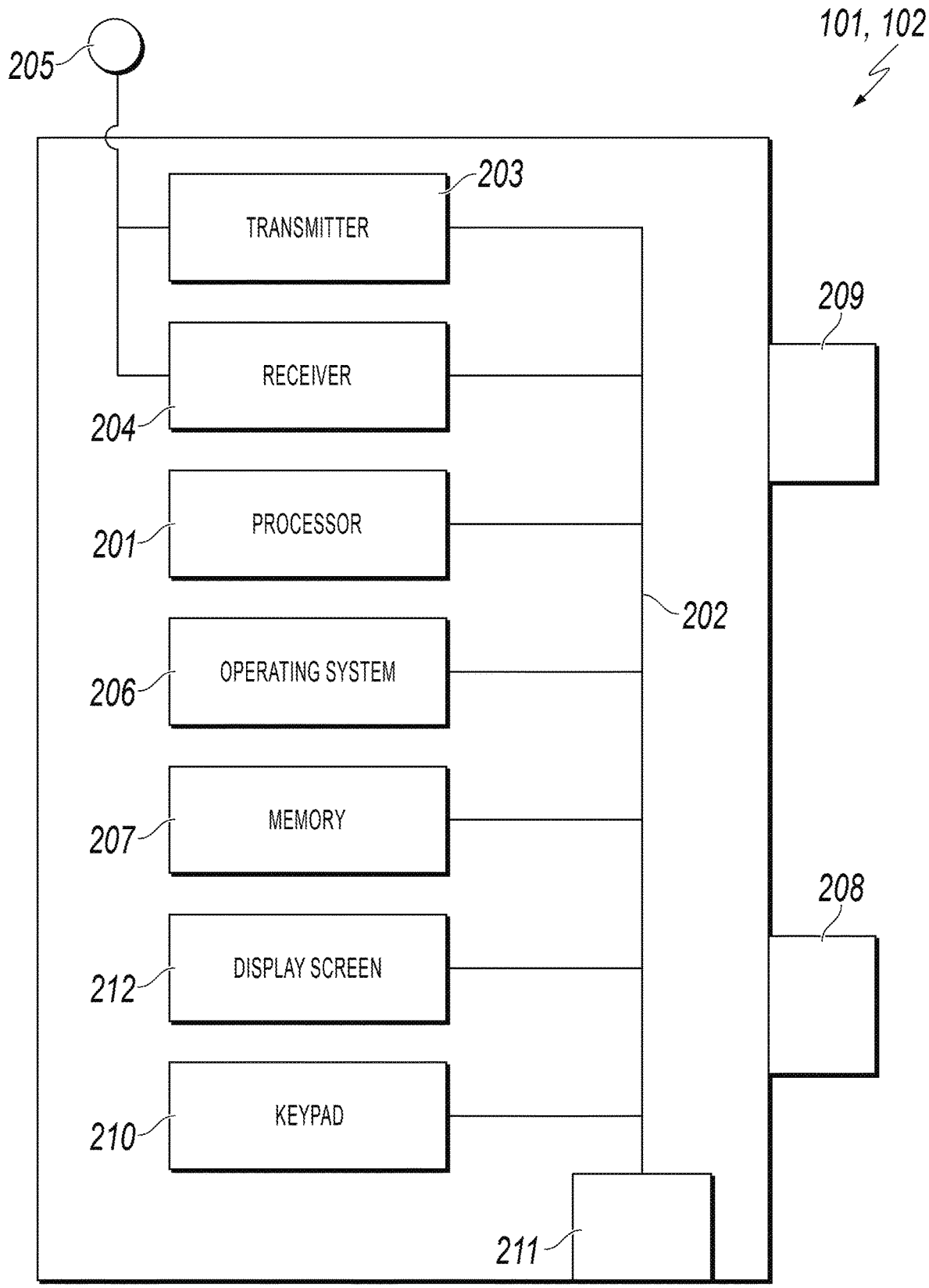
FIG. 2A illustrates a hardware configuration of a mobile device in accordance with an embodiment of the present invention.

Referring now to FIG. 2A, FIG. 2A illustrates a hardware configuration of mobile device 101, 102 (FIG. 1) which is representative of a hardware environment for practicing the present invention. Referring to FIG. 2A, mobile device 101, 102 has a processor 201 coupled to various other components by a system bus 202.

Mobile device 101, 102 further includes transmitter and receiver circuitry 203, 204 configured to wirelessly send and receive signals to and from a cellular network 103 (FIG. 1) or configured to wirelessly send and receive short range signals, such as Bluetooth, infrared or Wi-Fi, via wireless network 104 (FIG. 1). Transmitter and receiver circuitry 203, 204 are connected to an antenna 205 so as to transmit and receive radio frequency (RF) signals. In one embodiment, transmitter 203 and receiver 204 are operating simultaneously at the same frequency to implement full-duplex mode.

Mobile device 101, 102 further includes an operating system 206 that runs on processor 201 and provides control and coordinates the functions of the various components of FIG. 2A.

Mobile device 101, 102 further includes a memory 207 that is configured to store the requisite logic and parameters to control the transmitter/receiver circuitry 203, 204 and control the other functions of mobile device 101, 102. Memory 207 is generally integrated as part of the mobile device 101, 102 circuitry, but may, in some embodiments, include a removable memory, such as a removable disk memory, integrated circuit (IC) memory, a memory card, or the like. Processor 201 and memory 207 also implement the logic and store the settings, preferences and parameters for mobile device 101, 102. It should be noted that software components including operating system 206 may be loaded into memory 207, which may be mobile device's 101, 102 main memory for execution.

Mobile device 101, 102 also has a microphone 208 and speaker 209 for the user to speak and listen to callers. Speaker 209 may represent multiple speakers, at least some of which are configured to alert the user to incoming calls or messages. A keypad 210 is configured as part of mobile device 101, 102 for dialing telephone numbers and entering data. Mobile device 101, 102 may be configured with a data input/output (I/O) port 211 for downloading data, applications, programs and other information. In addition, mobile device 101, 102 typically includes a display screen 212 for displaying messages and information about incoming calls or other features of mobile device 101, 102 that use a graphic display.

Figure 2B:
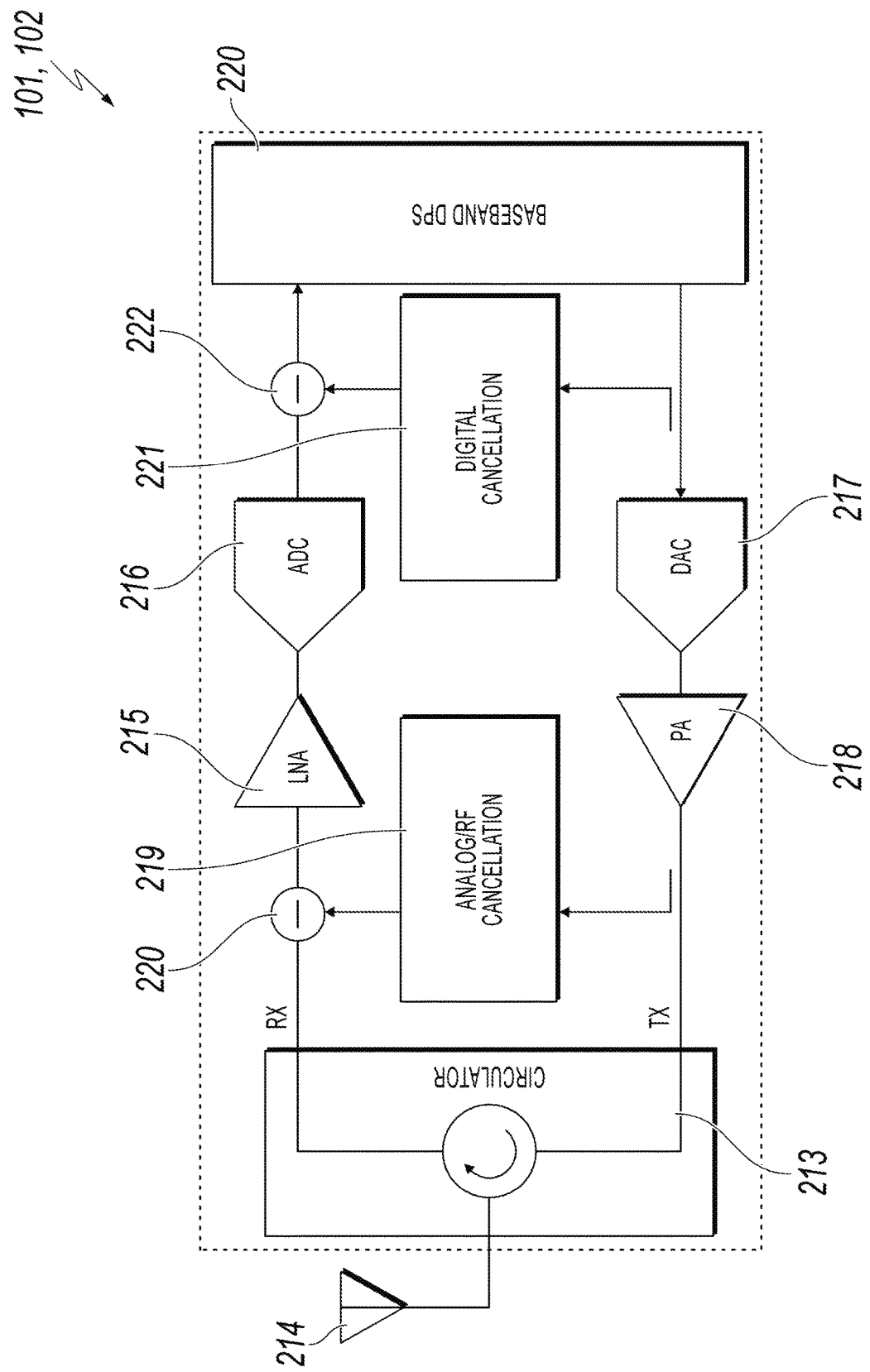
FIG. 2B illustrates a further hardware configuration of the mobile device in accordance with an embodiment of the present invention.

An illustration of a further hardware configuration of mobile device 101, 102 is discussed below in connection with FIG. 2B in accordance with an embodiment of the present invention. As shown in FIG. 2B, mobile device 101, 102 includes a circulator 213 in a full-duplex transceiver. Circulator 213 is connected to an antenna 214 for receiving (RX)/transmitting (TX) signals. In one embodiment, mobile device 101, 102 includes a low noise amplifier (LNA) 215 connected to an analog-to-digital converter (ADC) 216. Furthermore, mobile device 101, 102 includes a digital-to-analog converter (DAC) 217 connected to a power amplifier (PA) 218. The signal from PA 218 is inputted to circulator 213 or analog/RF cancellation unit 219 to generate an analog RF-cancellation signal. In one embodiment, the motivation for generating an analog RF-cancellation signal is to include all possible TX-chain impairments into the cancellation signal. As a result, PA-distortion and noise may be cancelled.

The analog RF-cancellation signal is subtracted from the receiving signal at 220, which is later inputted to LNA 215.

Furthermore, mobile device 101, 102, includes a baseband digital signal processor (DSP) 220 that encodes an original digital stream into a form suitable for transmission. Digital cancellation is performed by digital cancellation unit 221 whose output is subtracted from the digital signal outputted by ADC 216 at 222, which is then inputted to baseband DSP 220. The output of baseband DSP 220 is then inputted to digital cancellation unit 221 or DAC 217.

As discussed above in the Background section, there is not currently an effective means for RF cancellation using a circulator-based approach that breaks reciprocity in a cost-effective manner without the use of magnets.

The principles of the present invention provide a means for RF cancellation using a circulator-based approach that breaks reciprocity in a cost-effective manner without the use of magnets as discussed below. In particular, the present invention achieves non-reciprocity based on modulating a conventional reciprocal junction which consists of either bandpass, bandstop, lowpass, or highpass filters with appropriate amplitude and phase as discussed below.

Figure 3A:
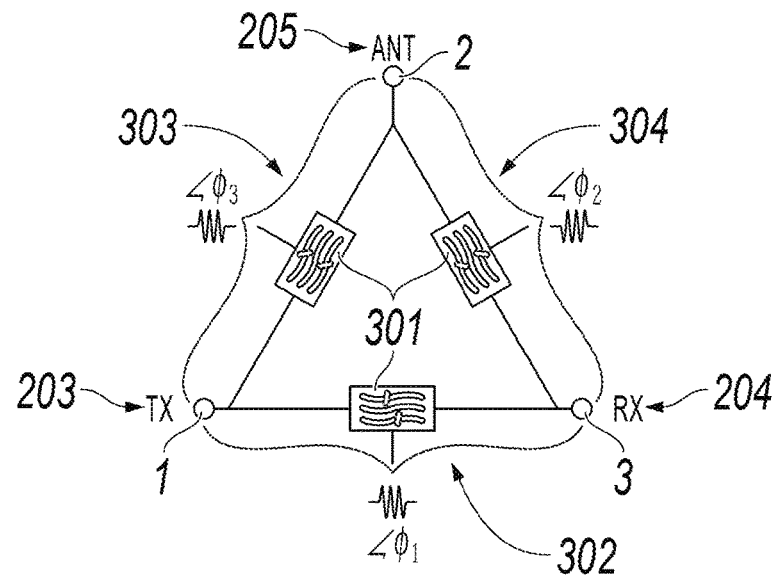
FIG. 3A illustrates using filters (bandpass) in the delta configuration in accordance with an embodiment of the present invention.
Figure 3B:
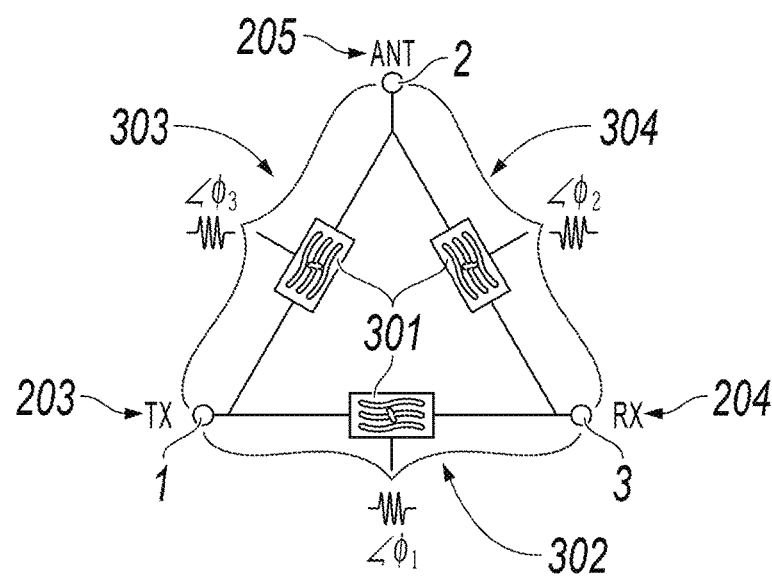
FIG. 3B illustrates using filters (bandstop) in the delta configuration in accordance with an embodiment of the present invention.
Figure 3C:
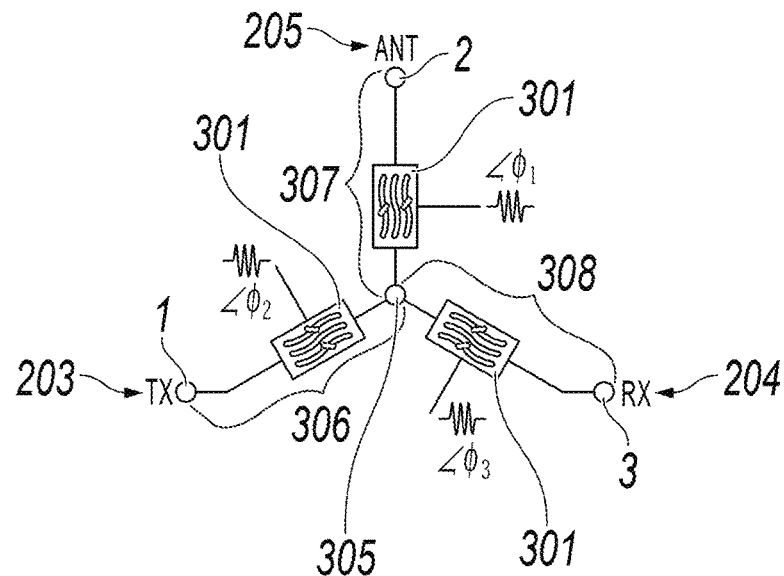
FIG. 3C illustrates using filters (bandpass) in the star configuration in accordance with an embodiment of the present invention.
Figure 3D:
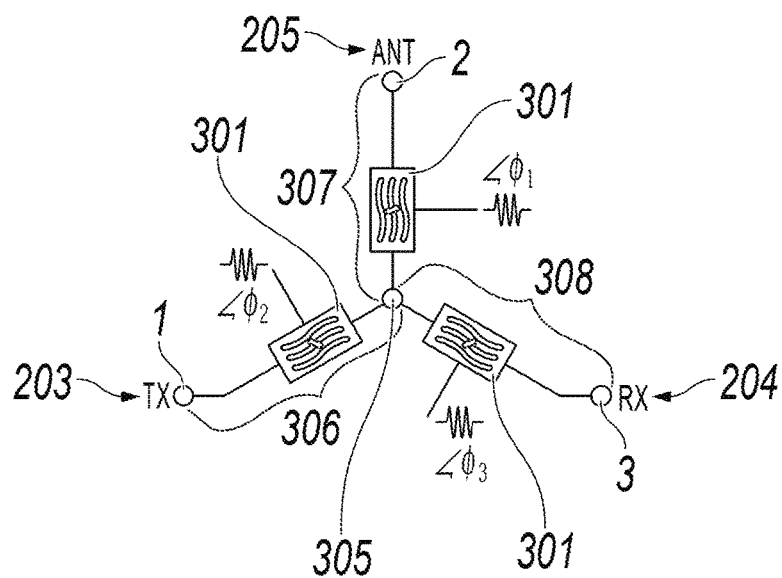
FIG. 3D illustrates using filters (bandstop) in the star configuration in accordance with an embodiment of the present invention.

Referring to FIGS. 3A-3D, FIGS. 3A-3D show four types of fully-symmetrical three-port junctions/branches (e.g., junction/branch 302 between transmitter 203 and receiver 204, junction/branch 303 between transmitter 204 and antenna 205 and junction/branch 304 between antenna 205 and receiver 204 as shown in FIGS. 3A-3B or junction/branch 306 between central node 305 and transmitter 203, junction/branch 307 between node 305 and antenna 205 and junction/branch 308 between node 305 and receiver 204 as shown in FIGS. 3C-3D) using filters 301 (bandpass or bandstop) in either delta (loop) or star (wye) configuration in accordance with an embodiment of the present invention. It is noted that the terms junctions and branches are used interchangeably and are used to connect pairs of neighboring input and output ports (transmitter 203, receiver 204 and antenna 205 are connected to ports designated as ports 1, 2 and 3) as shown in FIGS. 3A-3D.

FIG. 3A illustrates using filters 301 (bandpass) in the delta configuration in accordance with an embodiment of the present invention. FIG. 3B illustrates using filters 301 (bandstop) in the delta configuration in accordance with an embodiment of the present invention. FIG. 3C illustrates using filters 301 (bandpass) in the star configuration in accordance with an embodiment of the present invention. FIG. 3D illustrates using filters 301 (bandstop) in the star configuration in accordance with an embodiment of the present invention.

Figure 4A:
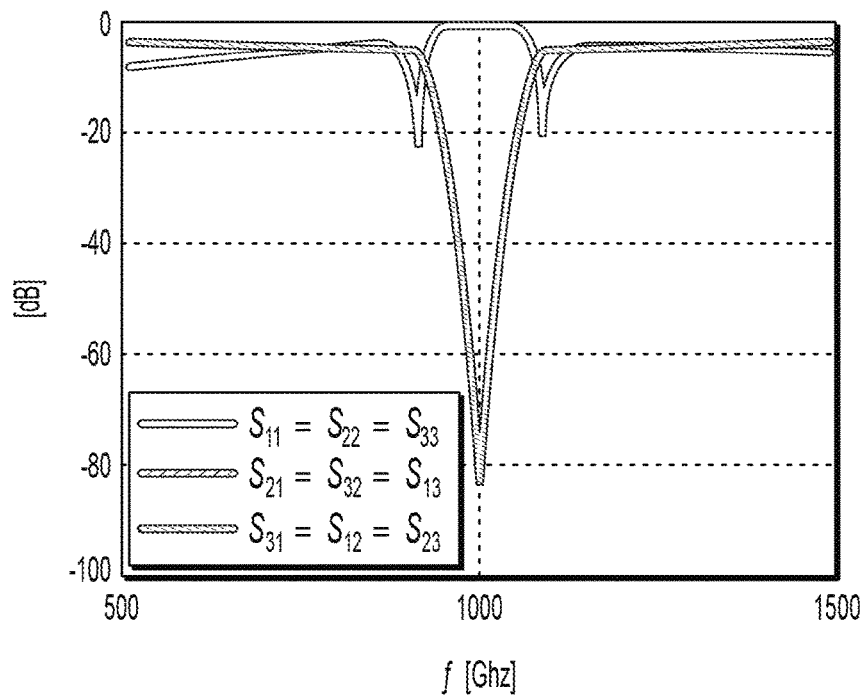
FIG. 4A illustrates the second order unmodulated junctions using bandstop filters in the delta configuration in accordance with an embodiment of the present invention.
Figure 4B:
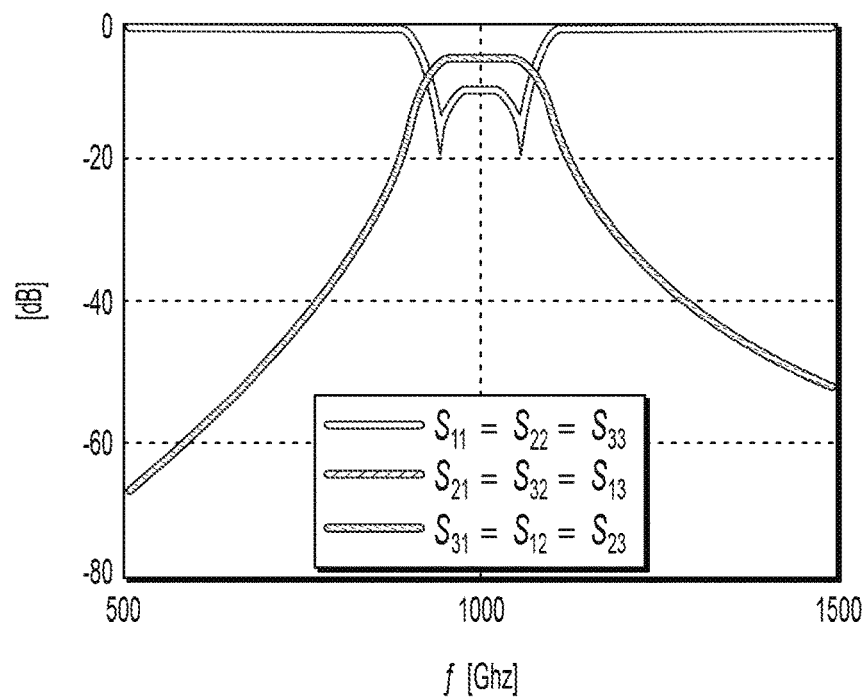
FIG. 4B illustrates the second order unmodulated junctions using bandpass filters in the star configuration in accordance with an embodiment of the present invention.

Without any modulation, an excitation at one port creates a symmetrical output at the two other ports as depicted from the symmetrical and reciprocal S-parameters (elements of a scattering matrix or S-matrix) shown in FIGS. 4A-4B. FIG. 4A illustrates the second order unmodulated junctions using bandstop filters 301 in the delta configuration in accordance with an embodiment of the present invention. FIG. 4B illustrates the second order unmodulated junctions using bandpass filters 301 in the star configuration in accordance with an embodiment of the present invention. It is noted for clarity that the subscripts 1, 2 and 3 shown in FIGS. 4A-4B for the S-parameters corresponds to the network ports 1, 2 and 3 shown in FIGS. 3A-3D.

In the bandpass junctions, some portion of the input power (one third at the center frequency) is reflected back to the source and the remaining part is equally split between the two other ports. In the bandstop junctions, an opposite response is achieved, i.e., input power is reflected back at the center frequency while the two output ports are equally isolated. In either case, the junction's order as implied by the number of poles in the constituent filters 301 determines the bandwidth, where a higher order expectedly leads to a larger bandwidth. In one embodiment, bandpass filters 301 can be replaced with low pass filters. In one embodiment, bandpass filters 301 can be replaced with high pass filters. In which case, they simplify to delay lines or reciprocal phase shifters which can be implemented at RF frequencies (up to few GHz) using lumped tee or pi sections. At higher mm-wave frequencies, this can be extended to microstrip or distributed element design. An example for such a delay line based implementation is discussed later herein.

Referring now to FIG. 5A, FIG. 5A is a circuit implementation of a $1^{st}$ order bandstop delta circulator in accordance with an embodiment of the present invention. As shown in FIG. 5A, filters 301 are comprised of varactors 501 and inductors $L_{RF}$ 502 where the values are shown in the table of FIG. 5A. Furthermore, as shown in FIG. 5A, each filter 301 is connected to a resistor 503 where the values are shown in the table of FIG. 5A. Additionally, each filter 301 is connected to inductor $L_m$ 504, capacitor $C_m$ 505 and capacitor $C_B$ 506 with a layout shown in FIG. 5A. The values of such elements are shown in the table of FIG. 5A. In one embodiment, a modulated signal (e.g., Mod1, Mod2, Mod3) and a DC signal (e.g., DC) are received by capacitor $C_B$ 506 and resistor 507, respectively, whose values are shown in the table of FIG. 5A.

Figure 5B:
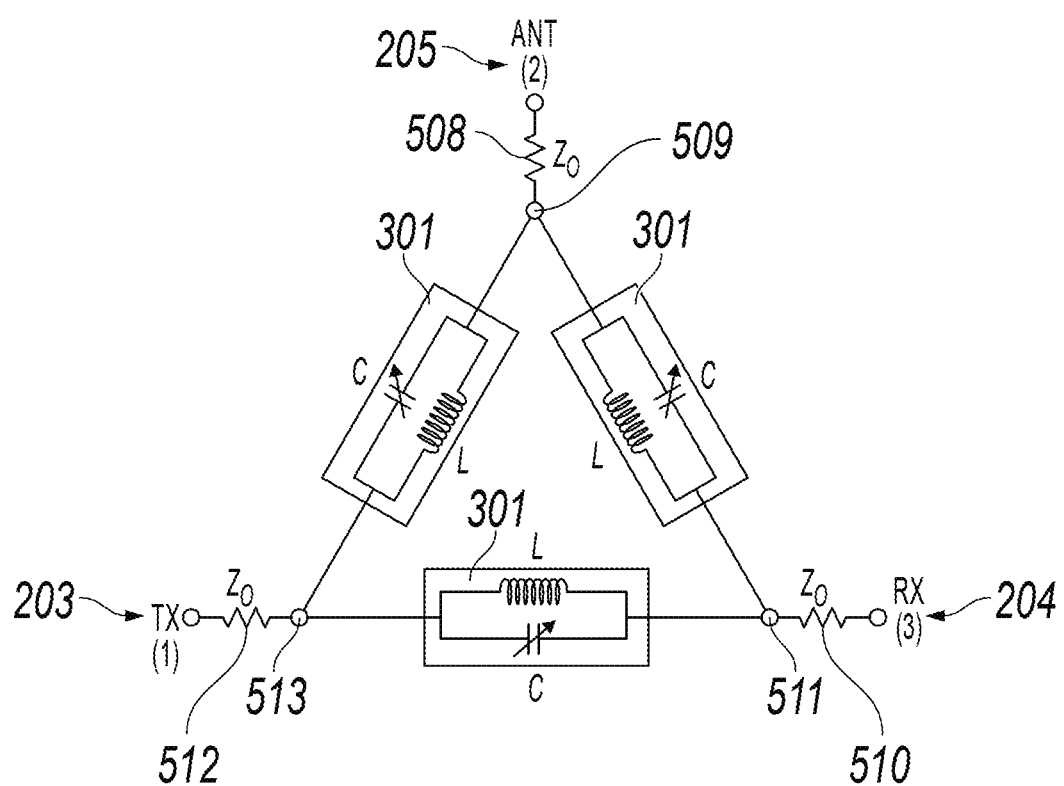
FIG. 5B is a circuit implementation of FIG. 5A in a simplified form for small-signal S-parameter analysis in accordance with an embodiment of the present invention.

FIG. 5B is a circuit implementation of FIG. 5A in a simplified form for small-signal S-parameter analysis in accordance with an embodiment of the present invention. As illustrated in FIG. 5B, filters 301 are simply represented by an inductor L in parallel with a capacitor C. Furthermore, as illustrated in FIG. 5B, a resistor 508 ($Z_o$) is placed between antenna 205 and point 509, a resistor 510 ($Z_o$) is placed between receiver 204 and point 511 and a resistor 512 ($Z_o$) is placed between transmitter 203 and point 513.

Without any loss of generality, the following discussion will focus on the bandstop delta junction in FIG. 3B as an example to show how time modulated filters 301 can achieve non-reciprocity. In this particular example, although the unmodulated junction does not allow transmission to any of the output ports, when modulation is applied, a window is opened inside the bandgap, allowing signal transmission to one of the output ports. It is stressed that this is the first time that such a technique is used to realize a circulator, and it does not have a counterpart in any of the existing circulator technologies. The simplest $1^{st}$ order junction can be implemented as shown in FIG. 5A.

The lone pole of this circuit is located at $p=1/\sqrt{LC}$, where C is the total capacitance of the common-cathode varactors. Under a small-signal assumption, as typically used to calculate the S-parameters, the circuit can be simplified as shown in FIG. 5B, where the varactors and their modulation network are replaced with linear time variant capacitors whose capacitance is given by $$C_n = C_0 + \Delta C \cos(\omega_m t + \varphi_n), n=1,2,3 \quad \text{(EQ 2)}$$

where $\Delta C = kV_m$, $C_0$ and $$k = \frac{dC}{dV}$$

are the varactors' static capacitance and C-V slope, respectively, $V_m$ and $\omega_m$ are the modulation signal voltage and frequency, respectively, $\varphi_n = (n-1) \times 120°$, and n is the port number. After a lengthy analysis, the S-parameters can be found as follows $$S_{11}(\omega) = \frac{Z_{in}(\omega) - Z_0}{Z_{in}(\omega) + Z_0} \quad \text{(EQ 3)}$$

$$S_{21}(\omega) = \frac{Z_0[I_2(\omega) - I_3(\omega)]}{V_{s1}(\omega)} \quad \text{(EQ 4)}$$

$$S_{31}(\omega) = \frac{Z_0[I_1(\omega) - I_2(\omega)]}{V_{s1}(\omega)} \quad \text{(EQ 5)}$$

where $$Z_{in}(\omega) = \frac{V_3(\omega) + Z_0[I_3(\omega) - I_2(\omega)]}{I_3(\omega) - I_1(\omega)} \quad \text{(EQ 6)}$$

$$V_1 = V_+ + V_- \quad \text{(EQ 7)}$$

$$V_2 = V_+ e^{j2\pi/3} + V_- e^{-j2\pi/3} \quad \text{(EQ 8)}$$

$$V_3 = V_+ e^{-j2\pi/3} + V_- e^{j2\pi/3} \quad \text{(EQ 9)}$$

$$V_\pm(\omega) = \quad \text{(EQ 10)}$$

$$\frac{\frac{j\omega}{6}(3j \mp \sqrt{3})\left(-3C_0 Z_0(\omega \pm \omega_m)^2 + \frac{3Z_0}{L} + j(\omega \pm \omega_m)\left(1 + \frac{3Z_0}{R}\right)\right) V_{s1}(\omega)}{\frac{-9}{4}\Delta C^2 Z_0^2 \omega^2(\omega \pm \omega_m)^2 + \left(-3C_0 Z_0 \omega^2 + \frac{3Z_0}{L} + j\omega\left(1 + \frac{3Z_0}{R}\right)\right)}$$

$$\left(-3C_0 Z_0(\omega \pm \omega_m)^2 + \frac{3Z_0}{L} + j(\omega \pm \omega_m)\left(1 + \frac{3Z_0}{R}\right)\right)$$

Figure 6A:
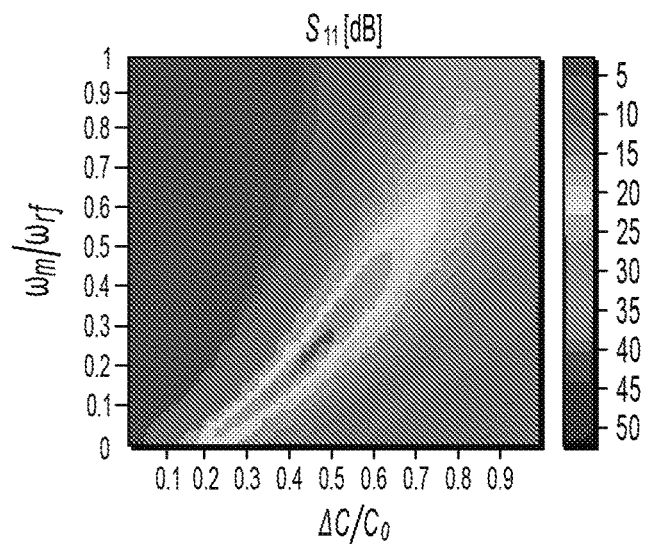
FIGS. 6A-6C illustrate the S-parameters in Equations 1.3-1.5 versus the modulation parameters $\Delta C = kV_m$ and $\omega_m$ for a quality factor $$Q = \frac{\omega L}{R} = 100$$
Figure 6B:
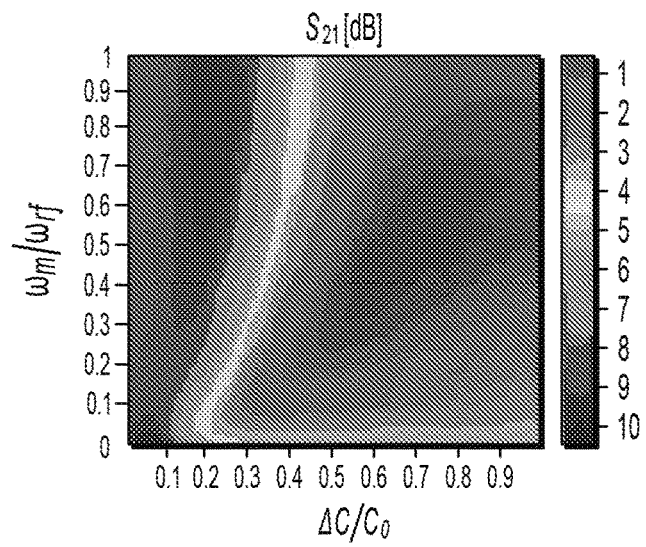
Figure 6C:
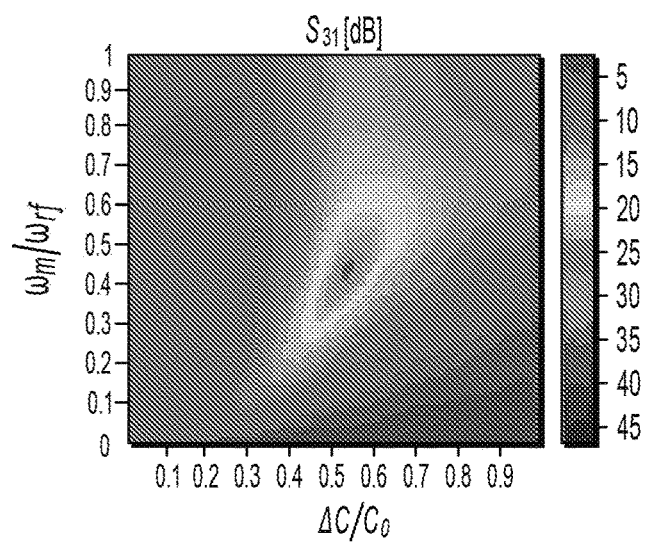

FIGS. 6A-6C illustrate the S-parameters $S_{11}$, $S_{21}$ and $S_{31}$, respectively, in Equations 3-5 versus the modulation parameters $\Delta C = kV_m$ and $\omega_m$ for a quality factor $$Q = \frac{\omega L}{R} = 100$$

in accordance with an embodiment of the present invention, which can be realized either with off-chip components for PCB designs or using bondwires for an integrated chip. Based on these charts, the optimal parameters can be found that lead to target specifications regarding the return, insertion losses, and isolation.

FIGS. 7A-7B illustrate the magnitude and phase, respectively, of the simulated S-parameters for the circuit in FIG. 5A on a conventional FR 4 board in accordance with an embodiment of the present invention. The values as well as the part/manufacturing number for the circuit elements are provided in the inset table of FIG. 5A. These results were obtained using the commercial software Agilent ADS while modeling the passive elements through their commercially available measured S-parameters and the complete non-linear spice models of the varactors including package parasitics. The center frequency was electrically tuned by changing the varactors' DC bias at three different channels covering a tunability range of about 10% around 900 MHz. Also, the "biasing" filters at the modulation ports were designed to provide a "voltage" gain, such that the modulation voltage across the varactors is larger than at the modulation source, therefore maximizing the capacitance variation of the varactors and relaxing the requirements on the modulation signal generators. The achieved insertion loss is better than −2 dB for all channels; the isolation is more than 50 dB at the center frequency of each channel. The return loss is also lower than −10 dB over any channel. On the other hand, since this is a three-port component, the bandwidth of each channel has to be appropriately defined. For the transmitted signal at port 2, the conventional −3 dB BW is used, while for the isolated port, the bandwidth is defined based on the minimum acceptable isolation which is −20 dB in many practical scenarios. The overall bandwidth is the intersection of both these two definitions and is 20 MHz for the current design. It is also important to distinguish the 20 MHz channel BW from the 10% (90 MHz) tunability bandwidth.

Another important metric for practical circulators is the maximum power level that they can handle in the transmit path. At high power levels, the insertion loss increases due to gain compression and the isolation also decreases because of the change in the effective modulation signal $v_{RF}+v_m$ applied on the varactors, as shown in solid lines in FIG. 8. FIG. 8 illustrates the simulated gain and isolation compression in accordance with an embodiment of the present invention. The optimized isolation at 20 dBm is shown in dashed lines.

Therefore, the maximum power level is generally given by $$P_{max} = \min\{P_{1\to 2}|_{-1\,dB}, P_{1\to 3}|_{20\,dB}\} \quad (EQ\ 11)$$

where 20 dB is the minimum acceptable isolation. However, the isolation can be actually optimized for a specific input power by adjusting $V_m$ and $V_{DC}$, making $P_{max}$ only determined by the −1 dB compression point. As an example, the isolation was optimized for 20 dBm input power as shown in dashed lines in FIG. 8. In the current design, $P_{1\to 2}|_{-1\,dB}$=25 dBm, which satisfies the specifications of many practical wireless systems. In fact, replacing the varactors with a bank of switched capacitors can lead to even higher values for the compression point. Moreover, the IIP3 for two in-band large signals with 1 MHz separation is 32 dBm as shown in FIG. 9. FIG. 9 illustrates the simulated IIP3 for two in-band large signals at 1 MHz offset in accordance with an embodiment of the present invention.

The noise performance is important in the receive path and is probably one of the main factors that prohibited the practical application of active circulators proposed to date. FIG. 10 shows that the current design can achieve a noise figure (NF) as low as 1.5 dB over the band of each channel. FIG. 10 illustrates the simulate noise figure (NF) in the receiver path for three channels in accordance with an embodiment of the present invention. In one embodiment, the noise figure value is calculated in the presence of a +20 dBm signal in the transmit path and −20 dBm signal in the receive path.

The bandwidth of this circuit can be further increased using a higher order filter (greater than a first-order filter). FIG. 11A illustrates a $2^{nd}$ order example using a bandpass star junction in accordance with an embodiment of the present invention. As illustrated in FIG. 11A, capacitor 1101 and inductor 1102 are connected between filter 301 and point 1103.

FIG. 11B illustrates the achieved S-parameters with a bandwidth of about 200 MHz in accordance with an embodiment of the present invention.

The bandwidth can be even further increased by using higher-order filters.

Analog modulation, as in all the designs presented so far, has the advantage of continuous reconfigurability, by changing the quiescent point of the circuit through the DC biasing of the varactors, and reduced power consumption, through the application of sinusoidal modulation. However, it complicates the modulation network design since it requires unmodulated "biasing" filters 301 to isolate the modulation and RF signals from leaking into the RF and modulation ports, respectively, as shown in FIG. 12A. FIG. 12A illustrates analog modulation through varactors in accordance with an embodiment of the present invention. In this regard, a Delta junction has an advantage over the Wye one, since the RF ports in the former become virtual ground at the modulation frequency, thus reducing the required number of biasing filters 301 and simplifying the overall design. However, for high order filters 301 targeting a broader bandwidth, the analog modulation network becomes very complicated and increases the size significantly as previously mentioned. In such a case, digital modulation, realized by either switching unmodulated filters with different center frequencies, as shown in FIG. 12B in accordance with an embodiment of the present invention, or by switching capacitors or inductors, as shown in FIG. 12C in accordance with an embodiment of the present invention, offers greater flexibility since the modulation network simplifies to digital clock generation which can be easily and compactly realized for filters 301 of any order in conventional IC technologies. Clearly, switched capacitors are more suitable for integrated circuits, but in FIG. 12C switched inductors were also included as an option for generality. FIG. 13A illustrates a $1^{st}$ order "digital" circulator based on a delta junction where filters 301 therein were realized using a (C-L-C) pi-network in accordance with an embodiment of the present invention. This is an example for the delay line based implementation that was previously mentioned. Simulation results using a 180 nm CMOS PDK to validate the circuit of FIG. 13A are shown in FIGS. 14A-14D in accordance with an embodiment of the present invention.

FIG. 13B illustrates an alternative embodiment of the $1^{st}$ order digital circulator based on a differential hybrid topology and digital modulation of bandpass filters in accordance with an embodiment of the present invention. Referring to FIG. 13B, the filters are realized by connecting inductors $L_o$ in delta configuration to remove sensitivity to parasitics at the central node. Also, as shown in FIG. 13B, series capacitors $C_o$ are connected to inductors $L_o$. Furthermore, FIG. 13B illustrates shunt capacitors $C_m$ at the terminals of the delta connection of inductors $L_o$ which are switched with grounded transistors $T_1$-$T_4$ to improve their power handling.

Modulation can also be applied asymmetrically to some of the branches, or even localized in a single branch such that it possesses a non-reciprocal phase response as shown in FIGS. 15A-15D. FIGS. 15A-15B illustrate modulation being applied asymmetrically to two branches in accordance with an embodiment of the present invention. FIGS. 15C-15D illustrate modulation being applied asymmetrically to a single branch in accordance with an embodiment of the present invention.

An asymmetric design has the potential advantage of achieving higher linearity and handling more power in the TX-ANT path in addition to isolating the TX from RX mismatch reflections, which may cause load-pull and instability issues at the TX. As an example to validate the claim, simulation results for the circuit in FIG. 15A are shown in FIG. 16 in accordance with an embodiment of the present invention.

Linearity can be further improved by applying all relevant circuit techniques commonly used with varactors and switches. For example, varactors can be stacked and connected in anti-series pairs to increase the compression and 3rd order intercept points, respectively as shown in FIG. 17A in accordance with an embodiment of the present invention. Switches can be similarly stacked as shown in FIG. 17B in accordance with an embodiment of the present invention or, in the case of CMOS technologies, connected as a transmission gate, be bootstrapped, have a floating body and gate, or be biased with a negative supply as shown in FIGS. 17C-17E in accordance with an embodiment of the present invention.

Similar techniques may be applied to non-CMOS integrated technologies. FIG. 18 illustrates the improvement in power handling for the circuit in FIG. 13A due to floating the body and gate of its CMOS switches and using a clock with a negative rail supply in accordance with an embodiment of the present invention.

Insertion loss can also be improved through parametric gain by adding another modulation signal at twice the operation frequency and applying it in phase to all branches as shown in FIG. 19. FIG. 19 illustrates the parametric gain using an additional in-phase modulation signal at twice the operation frequency in accordance with an embodiment of the present invention.

A comparison between the S-parameters of a lossy circulator without and with parametric gain is shown in FIGS. 20A-20B, respectively, in accordance with an embodiment of the present invention. Losses can also be compensated using a negative resistance as in active filters at the expense of degrading linearity and noise performance.

It is also noted that return loss, and consequently insertion loss, can be improved by using a lossless matching network at the ports. Such a network will also help in suppressing any intermodulation products, spurs, or leakage from the modulation sources. Matching networks can also perform impedance transformation at the ports, thus reducing the voltage to current ratio in the power signals. Therefore, the active components in the circulator "see" smaller voltage and their linearity is consequently improved, allowing the circulator to handle more power at the ports, thus improving P1 dB and IIP3. Matching networks can also be implemented as baluns in differential circulators, as will be explained further below.

Differential circuits are also known to be superior in all aspects to single-ended ones, including amplifiers, mixers, filters, etc. A differential (or balanced) design of the proposed circulator is shown in FIGS. 21A-21B. FIG. 21A illustrates a differential circulator using two circulators 2101, 2102 in accordance with an embodiment of the present invention. FIG. 21B illustrates a differential circulator using a single circulator with differential filters 301 in accordance with an embodiment of the present invention. Baluns 2103 are optional.

FIG. 21C illustrates a differential current-mode circulator using two single-ended circulators and single-ended ports in accordance with an embodiment of the present invention.

FIG. 22A illustrates an example for a detailed circuit implementation of FIG. 21A which comprises two single-ended circulators based on delta topology and bandstop filters in accordance with an embodiment of the present invention. As illustrated in FIG. 22A, analog modulation is applied through common-cathode varactors 2201.

FIG. 22B illustrates an example for a detailed circuit implementation of FIG. 21C which includes two single-ended circulators based on wye topology and bandpass filters in accordance with an embodiment of the present invention. As illustrated in FIG. 22B, analog modulation is applied through common-cathode varactors 2202.

In connection with FIG. 22A, FIG. 23 illustrates the experimental setup for measuring S-parameters in accordance with an embodiment of the present invention. Furthermore, FIGS. 24A-24B illustrate the S-parameters measured in accordance with an embodiment of the present invention. FIGS. 24C-24D illustrates the S-parameters simulated in accordance with an embodiment of the present invention.

FIGS. 24A and 24B show the measured S-parameters in magnitude and phase, respectively, from all ports for $V_{DC}$=7.3 V, $V_m$=0.8 V(rms), and $f_m$=100 MHz. Notice that the modulation parameters, particularly the amplitude, are much lower than their SE counterparts, yet the differential circuit still results in an even better performance. Specifically, the measured IL, RL and IX at the circulator's center frequency of 1 GHz are 1.78 dB, <−23 dB, and 24 dB, respectively, and the fractional BW is 2.2% (22 MHz). For the sake of comparison, the simulated S-parameters are also shown in FIGS. 24C and 24D where the simulated IL, RL and IX at 1 GHz are 1.7 dB, −22 dB, and 24 dB, respectively, and the fractional BW is 2.3% (23 MHz). Clearly, simulated and measured S-parameters are in very good agreement, yet they are different than the theoretical results. The reason is that RF baluns were not included in the small-signal analysis for simplicity. These baluns add more loss and, more importantly, result in a finite imbalance in the differential architecture due to random component mismatches. As one may expect, this imbalance is the reason for the slight asymmetry between different ports as shown in FIGS. 24A-24B. The baluns' loss is estimated using circuit/EM co-simulations to be 0.5 dB each, which if de-embedded from the measured results, the actual IL of the differential circulator at 1 GHz becomes 0.78 dB which is in good agreement with the theoretical results. It is worth mentioning that this is the insertion loss that the circuit would exhibit if it were connected directly to a differential transceiver, in which case the baluns are omitted. This is believed to be the lowest IL of all LPTV magnet-less circulators presented to date, with available room for further improvement in a more optimized design or by sacrificing the low modulation parameters and increasing their values. Interestingly, the current-mode topology does not even require such baluns, therefore the total IL in this case can easily go below 1 dB. The circulator can also be tuned for operation at different channels as shown in FIGS. 25A-25B by simply controlling the DC bias of the varactors, and adjusting the modulation voltage accordingly in order to account for the different slope of the CV characteristics at the new quiescent point. FIG. 25A illustrates the magnitude of the measured S-parameters at different channels by changing the DC bias and modulation voltage in accordance with an embodiment of the present invention. FIG. 25B illustrates the phase of the measured S-parameters at different channels by changing the DC bias and modulation voltage in accordance with an embodiment of the present invention. The maximum tunability range, while maintaining the same specs on S-parameters, was measured to be 60 MHz (6% of the band center frequency at 1 GHz).

FIG. 26A illustrates the measured harmonic spectrum at the transmitted and isolated ports for a single tone input at $f_{rf}=1$ GHz and $P_{in}=0$ dBm in accordance with an embodiment of the present invention. FIG. 26B illustrates the simulated harmonic spectrum at the transmitted and isolated ports for a single tone input at $f_{rf}=1$ GHz and $P_{in}=0$ dBm in accordance with an embodiment of the present invention.

FIGS. 26A and 26B show the measured and simulated harmonic spectrum, respectively, at both the transmitted ($P_{tr}$) and isolated ($P_{iso}$) ports for an incident signal at 1 GHz and 0 dBm. Despite that the measured IM products are as small as −29 dBc for a modulation frequency of only 10%, they are still finite, mainly due to the non-linear CV characteristics of the varactors. Random mismatches in the components, which are inevitable in practice, also play a role as they lead to finite imbalance not only in the RF baluns but more generally between the constituent single-ended (SE) circuits in any differential architecture. However, the impact of this imbalance is insignificant as can be deduced from the fact that the measured intermodulation (IM) products are in excellent agreement with simulations where this issue is neglected. It is noted that a SE implementation at 100 MHz would have resulted in even larger IM products and the overall performance, particularly isolation and insertion loss, would have become much worse.

FIGS. 27A and 27B illustrate the experimental setup of P1 dB and IIP3 measurements, respectively, in accordance with an embodiment of the present invention. FIG. 28 illustrates the measured and simulated P1 dB and maximum power handling in accordance with an embodiment of the present invention.

Non-linearity in STM circulators is exclusively due to the varactors which ultimately leads to compression of both IL and IX. The maximum power (Pmax) that a circulator can handle may be defined as the input power that guarantees an IL compression less than 1 dB (P1 dB) and at the same time maintains IX more than 20 dB (IX20 dB). FIG. 28 shows the measured and simulated results for both the transmitted power and isolation versus the input power at 1 GHz. The measured P1 dB and IX20 dB both occur at 28 dBm, thus resulting in Pmax of the same value, which is in good agreement with the simulated value of 30 dBm. Furthermore, a peaking in IX before Pmax was noticed since the capacitance variation ΔC at such high power is effectively reduced by the higher-order terms of the varactors' non-linear CV characteristics.

FIG. 29 illustrates the measured and simulated IIP3 in accordance with an embodiment of the present invention. FIG. 29 also shows the fundamental and third-order harmonic of the transmitted power for two in-band tones at 1 GHz with 1 MHz separation. The measured input-referred third-order intercept point (IIP3) is found to be 31 dBm and the simulated value is 33.8 dBm.

FIG. 30 illustrates the experimental setup of noise figure (NF) measurement in accordance with an embodiment of the present invention.

In general, different mechanisms contribute to the NF of STM circulators. This includes incoming noise from the RF ports which remains the same as in the SE architecture, assuming the typical 50 Ohm termination in both cases. However, noise generated by the circuit itself is doubled, very similarly to conventional differential circuits. In fact, the voltage-mode topology increases it even further because of additional loss in the RF baluns. Amplitude and phase noise in the modulation sources also add to the total NF, yet if the anti-phase STM bias of the constituent SE circulators is generated from the same sources, then this noise becomes strongly correlated at the terminals of the differential ports and, therefore, cancels out. Noise folding from the IM frequencies also adds more noise, but since the proposed differential circuits reduce these products, then their contribution becomes negligible. The reduction of the last two noise mechanisms, i.e., from the modulation sources and due to folding, is much stronger than the increased thermal noise generated by the circuit. Therefore, the overall NF improves. In fact, since the differential circuits are essentially pseudo LTI passive systems, then NF should be exactly equal to the IL. FIG. 31 illustrates the measured and simulated NF in accordance with an embodiment of the present invention, where the simulated value at 1 GHz is 1.8 dB, which is indeed nearly equal to the simulated IL, while the measured NF at 1 GHz is 2.5 dB which is about 0.7 dB larger than the measured IL due to imperfect cancellation of the IM products as discussed earlier. This is believed to be the smallest NF of all magnet-less circulators proposed to date.

The circuit in FIG. 32A incorporates two single-ended circulators 2101, 2102 with a 180° phase difference between their modulation signals. Such a phase difference guarantees that the even harmonics are in-phase at the two terminals of the output ports and therefore are cancelled out when the output is sensed differentially. However, the fundamental component, and the odd harmonics in general, appear out-of-phase and therefore sum up at the differential output ports. Cancellation of the $2^{nd}$ order IM products, particularly the component due to time variation, (see FIGS. 22A-22B which illustrate the differential harmonic calculator harmonic response for excitation at the $1^{st}$ port, where $v_{i+}$, $v_{i-}$ are the single-ended voltages of the positive and negative terminals, respectively, and $v_i=v_{i+}-v_{i-}$ is the differential voltage at the $i^{th}$ port in accordance with an embodiment of the present invention) enhances the non-reciprocity, reduces interference to neighboring channels and leads to a higher IIP2. Differential operation also improves the common mode rejection and noise figure by cancelling any common-mode leakage at the RF ports, including correlated phase noise from the modulation sources. It also improves the linearity since the RF signal is halved on each circulator allowing for a higher IIP3, compression point and dynamic range. Furthermore, S-parameters and bandwidth are also improved due to cancellation of the IM products' component of time variation, which is equivalent enhancing non-reciprocity. Or in other words, the power originally lost to the IM products in single-ended designs is now restored.

FIG. 33 illustrates the S-parameters for a differential design using two $1^{st}$ order bandstop delta circulators with inductors' Q of 100 as assumed in other designs, where insertion loss is less than 0.5 dB and return loss is more than 25 dB, in accordance with an embodiment of the present invention. The design of each circulator is also relaxed since the modulation frequency is reduced to only 100 MHz as compared to 240 MHz in the single-ended design counterpart of FIG. 5A. For fairness, modulation voltage, or equivalently the capacitance variation of the varactors, was kept the same, i.e., $\Delta C/C_0=0.5$. The two circulators can also be combined into a single one by using differential filters as shown in FIG. 21B. Baluns 2103 can also be used to convert the differential ports to single-ended if needed.

Modulated filters can also be used to design other non-reciprocal devices, such as isolators, which are equivalent to circulators with one port terminated in a matched load, gyrators and non-reciprocal phase shifters. As an example, modulating the coupling between two bandpass filters 3401, 3402 with a shifted center frequency ($f_m$) as shown in FIG. 34A in accordance with an embodiment of the present invention results in a new category of passive intermediate frequency (IF) mixers 3400. As shown in FIG. 34A, in one embodiment, bandpass filters 3401, 3402 are connected to capacitors 3403, 3404, respectively, which are each connected to ground. Furthermore, as illustrated in FIG. 34A, bandpass filters 3401, 3402 are connected to each other via switch 3405, which can be modulated as discussed above. In one embodiment, filters 3401, 3402 may correspond to bandstop filters as opposed to bandpass filters. In one embodiment, each filter 3401, 3402 has a different center frequency, where switch 3405 is modulated with the difference between these center frequencies.

Connecting two of these mixers 3400 (FIG. 34A) (represented as mixer 3400' and 3400" in FIG. 34B) by a reciprocal phase shifter 3406 or a delay line with a phase shift between the modulation frequencies ($f_m$, $\theta_1$ and $f_m$, $\theta_2$) leads to a non-reciprocal phase shifter 3407 as shown in FIG. 34B in accordance with an embodiment of the present invention. In one embodiment, the modulation frequency is phase shifted by a different amount for each of the mixers 3400', 3400". A gyrator is a special case of non-reciprocal phase shifters when the phase difference between transmission in opposite directions is 180 degrees and FIGS. 35A-35B provide simulation results for such a case using the circuit in FIG. 34B in accordance with an embodiment of the present invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A magnet-free multiple-port non-reciprocal device, comprising:
   one or more filters in one or more branches, wherein each of said one or more branches connects two ports;
   wherein poles and zeros of each of said one or more filters are modulated in time such that degenerate modes at each pole and zero are split thereby destructively interfering at one or more output ports and adding up at another output port creating isolation and non-reciprocal operation.

2. The magnet-free multiple-port non-reciprocal device as recited in claim 1, wherein each of said one or more filters comprises one of the following: a bandpass filter and a bandstop filter.

3. The magnet-free multiple-port non-reciprocal device as recited in claim 1, wherein one or more of said one or more filters comprise a low pass filter or a high pass filter.

4. The magnet-free multiple-port non-reciprocal device as recited in claim 1, wherein one or more of said one or more filters can be realized as a delay line.

5. The magnet-free multiple-port non-reciprocal device as recited in claim 1, wherein one or more of said one or more filters comprise an inductor-less N-path filter.

6. The magnet-free multiple-port non-reciprocal device as recited in claim 1, wherein one or more of said one or more filters comprise a higher order filter greater than a first-order filter.

7. The magnet-free multiple-port non-reciprocal device as recited in claim 1, wherein one or more of said one or more filters comprise inductors, capacitors, resistors, switches, transistors, or varactors.

8. The magnet-free multiple-port non-reciprocal device as recited in claim 1, wherein one or more of said one or more filters are digitally modulated by applying clock signals to switches.

9. The magnet-free multiple-port non-reciprocal device as recited in claim 1, wherein one or more of said one or more filters are analog modulated by applying modulation signals to varactors.

10. The magnet-free multiple-port non-reciprocal device as recited in claim 1 further comprising:
    a first branch between a first port and a second port;
    a second branch between said second port and a third port; and
    a third branch between said third port and said first port;
    wherein a second modulation signal of twice an operation frequency is applied in phase to said first, second and third branches.

11. The magnet-free multiple-port non-reciprocal device as recited in claim 1 further comprising:
    a matching network at an input port and output ports.

12. The magnet-free multiple-port non-reciprocal device as recited in claim 1 further comprising:
    a first branch between a first port and a second port;
    a second branch between said second port and a third port; and
    a third branch between said third port and said first port;
    wherein modulation is applied asymmetrically to one or more of said first, second and third branches.

13. The magnet-free multiple-port non-reciprocal device as recited in claim 1, wherein an input signal from a first port is transmitted to a second port but not in an opposite direction.

14. The magnet-free multiple-port non-reciprocal device as recited in claim 1, wherein one or more of said one or more filters are differential or balanced filters, wherein modulation is applied differentially to said one or more of said one or more filters.

15. The magnet-free multiple-port non-reciprocal device as recited in claim 14 further comprising:
    a balun at an input port and output ports.

16. The magnet-free multiple-port non-reciprocal device as recited in claim 1, wherein a first port is connected to a transmitter, a second port is connected to an antenna and a third port is connected to a receiver, wherein said transmitter and receiver are allowed to operate simultaneously and at a same frequency.

17. The magnet-free multiple-port non-reciprocal device as recited in claim 16, wherein an input signal from said first, second and third ports are transmitted to said second, third and first ports, respectively, but not in an opposite direction.

18. A magnet-free multiple-port differential non-reciprocal device, comprising:
   a first single-ended non-reciprocal device as recited in claim 1; and
   a second single-ended non-reciprocal device as recited in claim 1;
   wherein said first and second single-ended non-reciprocal devices are fed with a common source and an output is sensed with a common load, wherein said first and second single-ended non-reciprocal devices have a 180° phase difference between their modulation signals.

19. The magnet-free multiple-port differential non-reciprocal device as recited in claim 18 further comprising:
   a matching network at an input port and output ports.

20. A magnet-free multiple-port differential non-reciprocal device, comprising:
   a first single-ended non-reciprocal device as recited in claim 1; and
   a second single-ended non-reciprocal device as recited in claim 1;
   wherein said first and second single-ended non-reciprocal devices are fed differentially and an output is sensed differentially, wherein said first and second single-ended non-reciprocal devices have a 180° phase difference between their modulation signals.

21. The magnet-free multiple-port differential non-reciprocal device as recited in claim 20 further comprising:
   a balun at an input port and output ports.

22. The magnet-free multiple-port non-reciprocal device as recited in claim 20 further comprising:
   a matching network at an input port and output ports.

23. A magnet-free multiple-port non-reciprocal device, comprising:
   one or more filters in one or more branches, wherein each of said one or more branches connects a port and a central node;
   wherein poles and zeros of each of said one or more filters are modulated in time such that degenerate modes at each pole and zero are split thereby destructively interfering at one or more output ports and adding up at another output port creating isolation and non-reciprocal operation.

24. The magnet-free multiple-port non-reciprocal device as recited in claim 23, wherein each of said one or more filters comprises one of the following: a bandpass filter and a bandstop filter.

25. The magnet-free multiple-port non-reciprocal device as recited in claim 23, wherein one or more of said one or more filters comprise a low pass filter or a high pass filter.

26. The magnet-free multiple-port non-reciprocal device as recited in claim 23, wherein one or more of said one or more filters can be realized as a delay line.

27. The magnet-free multiple-port non-reciprocal device as recited in claim 23, wherein one or more of said one or more filters comprise an inductor-less N-path filter.

28. The magnet-free multiple-port non-reciprocal device as recited in claim 23, wherein one or more of said one or more filters comprise a higher order filter greater than a first-order filter.

29. The magnet-free multiple-port non-reciprocal device as recited in claim 23, wherein one or more of said one or more filters comprise inductors, capacitors, resistors, switches, transistors, or varactors.

30. The magnet-free multiple-port non-reciprocal device as recited in claim 23, wherein one or more of said one or more filters are digitally modulated by applying clock signals to switches.

31. The magnet-free multiple-port non-reciprocal device as recited in claim 23, wherein one or more of said one or more filters are analog modulated by applying modulation signals to varactors.

32. The magnet-free multiple-port non-reciprocal device as recited in claim 23 further comprising:
   a first branch between a first port and a second port;
   a second branch between said second port and a third port; and
   a third branch between said third port and said first port;
   wherein a second modulation signal of twice an operation frequency is applied in phase to said first, second and third branches.

33. The magnet-free multiple-port non-reciprocal device as recited in claim 23 further comprising:
   a matching network at an input port and output ports.

34. The magnet-free multiple-port non-reciprocal device as recited in claim 23,
   a first branch between a first port and a second port;
   a second branch between said second port and a third port; and
   a third branch between said third port and said first port;
   wherein modulation is applied asymmetrically to one or more of said first, second and third branches.

35. The magnet-free multiple-port non-reciprocal device as recited in claim 23, wherein an input signal from a first port is transmitted to a second port but not in an opposite direction.

36. The magnet-free multiple-port non-reciprocal device as recited in claim 23, wherein one or more of said one or more filters are differential or balanced filters, wherein modulation is applied differentially to said one or more of said one or more filters.

37. The magnet-free multiple-port non-reciprocal device as recited in claim 36 further comprising:
   a balun at an input port and output ports.

38. The magnet-free multiple-port non-reciprocal device as recited in claim 23, wherein a first port is connected to a transmitter, a second port is connected to an antenna and a third port is connected to a receiver, wherein said transmitter and receiver are allowed to operate simultaneously and at a same frequency.

39. The magnet-free multiple-port non-reciprocal device as recited in claim 38, wherein an input signal from said first, second and third ports are transmitted to said second, third and first ports, respectively, but not in an opposite direction.

40. A magnet-free multiple-port differential non-reciprocal device, comprising:
   a first single-ended non-reciprocal device as recited in claim 23; and
   a second single-ended non-reciprocal device as recited in claim 23;
   wherein said first and second single-ended non-reciprocal devices are fed with a common source and an output is sensed with a common load, wherein said first and second single-ended non-reciprocal devices have a 180° phase difference between their modulation signals.

41. The magnet-free multiple-port non-reciprocal device as recited in claim 40 further comprising:
   a matching network at an input port and output ports.

42. A magnet-free multiple-port differential non-reciprocal device, comprising:
   a first single-ended non-reciprocal device as recited in claim 23; and
   a second single-ended non-reciprocal device as recited in claim 23;
   wherein said first and second single-ended non-reciprocal devices are fed differentially and an output is sensed differentially, wherein said first and second single-ended non-reciprocal devices have a 180° phase difference between their modulation signals.

43. The magnet-free multiple-port differential non-reciprocal device as recited in claim 42 further comprising:
   a balun at an input port and output ports.

44. The magnet-free multiple-port non-reciprocal device as recited in claim 42 further comprising:
   a matching network at an input port and output ports.

45. A magnet-free multiple-port non-reciprocal device, comprising:
   one or more filters, wherein three or more elements of said one or more filters comprise a central loop and one or more elements of said one or more filters connect a port and a node of said central loop;
   wherein poles and zeros of each of said one or more filters are modulated in time such that degenerate modes at each pole and zero are split thereby destructively interfering at one or more output ports and adding up at another output port creating isolation and non-reciprocal operation.

46. The magnet-free multiple-port non-reciprocal device as recited in claim 45, wherein each of said one or more filters comprises one of the following: a bandpass filter or a bandstop filter.

47. The magnet-free multiple-port non-reciprocal device as recited in claim 45, wherein one or more of said one or more filters comprise a low pass filter or a high pass filter.

48. The magnet-free multiple-port non-reciprocal device as recited in claim 45, wherein one or more of said one or more filters can be realized as a delay line.

49. The magnet-free multiple-port non-reciprocal device as recited in claim 45, wherein one or more of said one or more filters comprise an inductor-less N-path filter.

50. The magnet-free multiple-port non-reciprocal device as recited in claim 45, wherein one or more of said one or more filters comprise a higher order filter greater than a first-order filter.

51. The magnet-free multiple-port non-reciprocal device as recited in claim 45, wherein one or more of said one or more filters comprise inductors, capacitors, resistors, switches, transistors, or varactors.

52. The magnet-free multiple-port non-reciprocal device as recited in claim 45, wherein one or more of said one or more filters are digitally modulated by applying clocks signals to switches.

53. The magnet-free multiple-port non-reciprocal device as recited in claim 45, wherein one or more of said one or more filters are analog modulated by applying modulation signals to varactors.

54. The magnet-free multiple-port non-reciprocal device as recited in claim 45 further comprising:
   a first branch between a first port and a second port;
   a second branch between said second port and a third port; and
   a third branch between said third port and said first port;
   wherein a second modulation signal larger than an operation frequency is applied in phase to said first, second and third branches.

55. The magnet-free multiple-port non-reciprocal device as recited in claim 45 further comprising:
   a matching network at an input port and output ports.

56. The magnet-free multiple-port non-reciprocal device as recited in claim 45,
   a first branch between a first port and a second port;
   a second branch between said second port and a third port; and
   a third branch between said third port and said first port;
   wherein modulation is applied asymmetrically to one or more of said first, second and third branches.

57. The magnet-free multiple-port non-reciprocal device as recited in claim 45, wherein an input signal from a first port is transmitted to a second port but not in an opposite direction.

58. The magnet-free multiple-port non-reciprocal device as recited in claim 45, wherein one or more of said one or more filters are differential or balanced filters, wherein modulation is applied differentially to said one or more of said one or more filters.

59. The magnet-free multiple-port non-reciprocal device as recited in claim 58 further comprising:
   a balun at an input port and output ports.

60. The magnet-free multiple-port non-reciprocal device as recited in claim 45, wherein a first port is connected to a transmitter, a second port is connected to an antenna and a third port is connected to a receiver, wherein said transmitter and receiver are allowed to operate simultaneously and at a same frequency.

61. The magnet-free multiple-port non-reciprocal device as recited in claim 60, wherein an input signal from said first, second and third ports is transmitted to said second, third and first ports, respectively, but not in an opposite direction.

62. A magnet-free multiple-port differential non-reciprocal device, comprising:
   a first single-ended non-reciprocal device as recited in claim 45; and
   a second single-ended non-reciprocal device as recited in claim 45;
   wherein said first and second single-ended non-reciprocal devices are fed with a common source and an output is sensed with a common load, wherein said first and second single-ended non-reciprocal devices have a 180° phase difference between their modulation signals.

63. The magnet-free multiple-port non-reciprocal device as recited in claim 62 further comprising:
   a matching network at an input port and output ports.

64. A magnet-free multiple-port differential non-reciprocal device, comprising:
   a first single-ended non-reciprocal device as recited in claim 45; and
   a second single-ended non-reciprocal device as recited in claim 45;
   wherein said first and second single-ended non-reciprocal devices are fed differentially and an output is sensed differentially, wherein said first and second single-ended non-reciprocal devices have a 180° phase difference between their modulation signals.

65. The magnet-free multiple-port differential non-reciprocal device as recited in claim 64 further comprising:
   a balun at an input port and output ports.

66. The magnet-free multiple-port non-reciprocal device as recited in claim 64 further comprising:
   a matching network at an input port and output ports.

* * * * *